US011686788B2

(12) United States Patent
Ota et al.

(10) Patent No.: US 11,686,788 B2
(45) Date of Patent: Jun. 27, 2023

(54) MAGNETIC SENSOR DEVICE AND MAGNETIC SENSOR SYSTEM

(71) Applicant: TDK CORPORATION, Tokyo (JP)

(72) Inventors: Norikazu Ota, Tokyo (JP); Hiraku Hirabayashi, Tokyo (JP); Kazuma Yamawaki, Tokyo (JP); Shuhei Miyazaki, Tokyo (JP); Kazuya Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/734,674

(22) Filed: May 2, 2022

(65) Prior Publication Data

US 2023/0008088 A1 Jan. 12, 2023

Related U.S. Application Data

(60) Provisional application No. 63/219,584, filed on Jul. 8, 2021.

(30) Foreign Application Priority Data

Mar. 17, 2022 (JP) ................. 2022-042704

(51) Int. Cl.
*G01R 33/09* (2006.01)
*G01R 33/02* (2006.01)

(52) U.S. Cl.
CPC ....... *G01R 33/098* (2013.01); *G01R 33/0206* (2013.01); *G01R 33/093* (2013.01)

(58) Field of Classification Search
CPC . G01R 33/098; G01R 33/0206; G01R 33/093
See application file for complete search history.

(56) References Cited

U.S. PATENT DOCUMENTS

| 6,366,079 | B1 | 4/2002 | Uenoyama |
| 2003/0173955 | A1 | 9/2003 | Uenoyama |
| 2009/0027048 | A1 | 1/2009 | Sato et al. |
| 2010/0032778 | A1* | 2/2010 | Lu .................. G11C 11/1673 |
| | | | 257/E43.001 |
| 2014/0247042 | A1 | 9/2014 | Lei et al. |
| 2015/0185297 | A1* | 7/2015 | Zimmer .............. G01R 33/095 |
| | | | 324/252 |
| 2018/0356473 | A1* | 12/2018 | Hirota ................. G01R 33/093 |

(Continued)

FOREIGN PATENT DOCUMENTS

| JP | 2011-154007 A | 8/2011 |
| JP | 2014-529743 A | 11/2014 |

(Continued)

*Primary Examiner* — Alvaro E Fortich
(74) *Attorney, Agent, or Firm* — Oliff PLC

(57) ABSTRACT

A magnetic sensor device includes at least one magnetic sensor and a support. A center of gravity of an element layout area of the at least one magnetic sensor is deviated from a center of gravity of a reference plane of the support. The at least one magnetic sensor includes four resistor sections constituted by a plurality of magnetoresistive elements. Magnetization of a free layer in each of two of the resistor sections includes a component in a third magnetization direction. The magnetization of a free layer in each of the other two resistor sections includes a component in a fourth magnetization direction opposite to the third magnetization direction.

22 Claims, 14 Drawing Sheets

(56) References Cited

U.S. PATENT DOCUMENTS

| | | | |
|---|---|---|---|
| 2018/0356474 A1* | 12/2018 | Hammerschmidt | ... H10N 50/10 |
| 2019/0293731 A1* | 9/2019 | Watanabe | ............. H10N 50/10 |
| 2020/0096368 A1 | 3/2020 | Kobayashi et al. | |
| 2020/0300668 A1 | 9/2020 | Saruki et al. | |

FOREIGN PATENT DOCUMENTS

| | | |
|---|---|---|
| JP | 2015-007551 A | 1/2015 |
| JP | 2015-095630 A | 5/2015 |
| JP | 2016-145745 A | 8/2016 |
| JP | 2020-153665 A | 9/2020 |
| WO | 2012/172946 A1 | 12/2012 |
| WO | 2015/125699 A1 | 8/2015 |

\* cited by examiner

MAGNETIC SENSOR DEVICE AND MAGNETIC SENSOR SYSTEM

CROSS REFERENCE TO RELATED APPLICATIONS

This application claims the benefit of U.S. Provisional Patent Application No. 63/219,584 filed on Jul. 8, 2021 and Japanese Priority Patent Application No. 2072-42704 filed on Mar. 17, 2022, the entire contents of each of which are incorporated herein by their reference.

BACKGROUND

The technology relates to a magnetic sensor device including a magnetic sensor and a support.

A magnetic sensor device for detecting components in a plurality of directions of an applied magnetic field has recently been used in a variety of applications. One example of the applications of the magnetic sensor device includes a magnetic position detection device that detects the position of a magnet movable in three dimensions.

The magnetic position detection device includes, for example, a magnetic sensor device, a magnet movable along a predetermined spherical surface around the magnetic sensor device, and a signal processing circuit. The magnetic sensor device detects three components in three mutually different directions of a magnetic field generated by the magnet and applied to the magnetic sensor device, and generates three detection signals corresponding to the three components. Based on the three detection signals, the signal processing circuit generates position information indicating the position of the magnet. US 2009/0027048 A1 discloses a three-axis magnetic sensor including an X-axis sensor, a Y-axis sensor, and a Z-axis sensor.

To improve the accuracy of the position information, the detection accuracy of the magnetic sensor device needs to be improved. JP 2015-95630 A discloses a magnetic sensor including a first magnetoresistive element and a second magnetoresistive element whose free layers are magnetized in opposite directions, whereby a drop in the detection accuracy of an external magnetic field due to variations in the magnetization directions of the pinned layers is reduced. WO 2012/172946 and WO 2015/125699 disclose a magnetic sensor including a pair of magnetoresistive elements whose free magnetic layers are magnetized in opposite directions, whereby a drop in the linearity of the sensor output due to deviations in the direction of a magnetic field to be measured is reduced.

In using the position detection device, an unintended external force can act on the substrate on which the magnetic sensor device is mounted. Moreover, the substrate temperature can change due to a change in the environment. In such cases, stress is applied to the magnetic sensor device, and as a result an error can occur in the detection signal of the magnetic sensor device.

Suppose that the substrate has a simple planar shape such as a rectangular shape. If stress is generated in the substrate due to an external force or temperature, the stress distribution within the substrate is symmetrical about the center of gravity of the planar shape of the substrate. To reduce the effect of the stress, the magnetic sensor can be mounted on the substrate so that the center of gravity of the planar shape of the magnetic sensor matches that of the substrate. However, in a three-axis magnetic sensor such as the one disclosed in US 2009/0027048 A1 all the sensors are not able to be mounted in the foregoing manner. Moreover, there are components other than magnetic sensors, like terminals, on the actual substrate. Magnetic sensors are therefore not always able to be mounted in the foregoing manner.

SUMMARY

A magnetic sensor device according to one embodiment of the technology includes at least one magnetic sensor configured to detect a target magnetic field that is a magnetic field to be detected, the at least one magnetic sensor including a plurality of magnetoresistive elements and an element layout area for laying out the plurality of magnetoresistive elements, and a support that supports the at least one magnetic sensor and has a reference plane. When the magnetic sensor device is seen in a first reference direction, a center of gravity of the element layout area is deviated from a center of gravity of the reference plane. The first reference direction is a direction perpendicular to the reference plane.

The at least one magnetic sensor further includes a first resistor section and a second resistor section connected in series in a first path that is a path electrically connecting a first connection point and a second connection point, and a third resistor section and a fourth resistor section connected in series in a second path that is a path electrically connecting the first connection point and the second connection point. The first and fourth resistor sections are connected to the first connection point. The second and third resistor sections are connected to the second connection point. The plurality of magnetoresistive elements constitute the first to fourth resistor sections. Each of the plurality of magnetoresistive elements includes a magnetization pinned layer having magnetization whose direction is fixed, a free layer having magnetization whose direction is variable depending on the target magnetic field, and a gap layer located between the magnetization pinned layer and the free layer.

The magnetization of the magnetization pinned layer in each of the first and third resistor sections includes a component in a first magnetization direction. The first magnetization direction is a direction intersecting the first reference direction. The magnetization of the magnetization pinned layer in each of the second and fourth resistor sections includes a component in a second magnetization direction. The second magnetization direction is a direction intersecting the first reference direction and opposite to the first magnetization direction. The magnetization of the free layer in each of two of the first to fourth resistor sections includes a component in a third magnetization direction when the target magnetic field is not applied to the at least one magnetic sensor. The third magnetization direction is a direction intersecting the first reference direction and orthogonal to the first magnetization direction. The magnetization of the free layer in each of the other two of the first to fourth resistor sections includes a component in a fourth magnetization direction when the target magnetic field is not applied to the at least one magnetic sensor. The fourth magnetization direction is a direction intersecting the first reference direction and opposite to the third magnetization direction.

In the magnetic sensor device according to one embodiment of the technology, the magnetization of the free layer in each of the first and second resistor sections may include a component in the third magnetization direction when the target magnetic field is not applied to the at least one magnetic sensor. The magnetization of the free layer in each of the third and fourth resistor sections may include a component in the fourth magnetization direction when the target magnetic field is not applied to the at least one magnetic sensor. Alternatively, the magnetization of the free layer in each of the first and fourth resistor sections may include a component in the third magnetization direction when the target magnetic field is not applied to the at least one magnetic sensor. The magnetization of the free layer in each of the second and third resistor sections may include a component in the fourth magnetization direction when the target magnetic field is not applied to the at least one magnetic sensor.

In the magnetic sensor device according to one embodiment of the technology, a deviation of the center of gravity of the element layout area from the center of gravity of the reference plane in a second reference direction may be greater than a deviation of the center of gravity of the element layout area from the center of gravity of the reference plane in a third reference direction. The second reference direction and the third reference direction may be two directions orthogonal to the first reference direction. In such a case, an angle that the first magnetization direction forms with respect to the second reference direction may be in a range greater than 0° and less than 90°.

In the magnetic sensor device according to one embodiment of the technology, the at least one magnetic sensor may further include a magnetic field generator. The magnetic field generator may be configured to apply a magnetic field, in a direction intersecting each of the first to fourth magnetization directions, to the free layer. Alternatively, the magnetic field generator may be configured to apply a magnetic field, in the third magnetization direction or in the fourth magnetization direction, to the free layer.

In the magnetic sensor device according to one embodiment of the technology, a deviation of the center of gravity of the element layout area from t center of gravity of the reference plane in a second reference direction may be greater than a deviation of the center of gravity of the element layout area from the center of gravity of the reference plane in a third reference direction. The second reference direction and the third reference direction may be two directions orthogonal to the first reference direction. The element layout area may include a first area for laying out at least one magnetoresistive element constituting the first resistor section among the plurality of magnetoresistive elements, a second area for laying out at least one magnetoresistive element constituting the second resistor section among the plurality of magnetoresistive elements, a third area for laying out at least one magnetoresistive element constituting the third resistor section among the plurality of magnetoresistive elements, and a fourth area for laying out at least one magnetoresistive element constituting the fourth resistor section among the plurality of magnetoresistive elements. At least two of the first to fourth areas may be arranged along the third reference direction so that at least parts of the respective at least two areas sandwich a reference axis therebetween when the areas are seen in the first reference direction. The reference axis may be a straight line parallel to the second reference direction and passing through the center of gravity of the reference plane.

If the deviation of the center of gravity of the element layout area from the center of gravity of the reference plane in the second reference direction is greater than the deviation of the center of gravity of the element layout area from the center of gravity of the reference plane in the third reference direction, the second area and the fourth area may be arranged along the third reference direction to sandwich the reference axis therebetween when the areas are seen in the first reference direction. The first area may be located between the second area and the fourth area when the areas are seen in the first reference direction. The third area may be located between the first area and the second area when the areas are seen in the first reference direction. Alternatively, in such a case, the second area and the third area may be arranged along the third reference direction to sandwich the reference axis therebetween when the areas are seen in the first reference direction. The first area may be located between the second area and the third area when the areas are seen in the first reference direction. The fourth area may be located between the first area and the third area when the areas are seen in the first reference direction.

Alternatively, in such a case, the first area and the fourth area may be arranged along the third reference direction so that at least parts of the respective first and fourth areas sandwich the reference axis therebetween when the areas are seen in the first reference direction. The second area and the third area may be arranged along the third reference direction so that at least parts of the respective second and third areas sandwich the reference axis therebetween when the areas are seen in the first reference direction. The second area and the third area may be located forward of the first area and the fourth area, respectively, in a direction parallel to the second reference direction. In such a case, the first area and the second area may be symmetrically arranged about a virtual straight line orthogonal to the reference axis when the areas are seen in the first reference direction. The third area and the fourth area may be symmetrically arranged about the virtual straight line when the areas are seen in the first reference direction.

If the deviation of the center of gravity of the element layout area from the center of gravity of the reference plane in the second reference direction is greater than the deviation of the center of gravity of the element layout area from the center of gravity of the reference plane in the third reference direction, at least two areas are symmetrically arranged about the reference axis when the areas are seen in the first reference direction.

In such a case, the center of gravity of the element layout area may overlap the reference axis when the element layout area is seen in the first reference direction.

In the magnetic sensor device according to one embodiment of the technology, the at least one magnetic sensor may include one magnetic sensor. The one magnetic sensor may be configured to detect a component of the target magnetic field in one direction, and generate at least one detection signal having a correspondence with the component in the one direction. In such a case, the magnetic sensor device according to the technology may further include a chip including the one magnetic sensor. The chip may be mounted on the reference plane.

In the magnetic sensor device according to one embodiment of the technology, the at least one magnetic sensor may include two magnetic sensors. The two magnetic sensors may be configured to detect components of the target magnetic field in two directions different from each other. In such a case, the magnetic sensor device according to the technology may further include a chip including the two magnetic sensors. The chip may be mounted on the reference plane. In such a case, each of the two directions of the target magnetic field may be a direction oblique to both the reference plane and the first reference direction.

In the magnetic sensor device according to one embodiment of the technology, the at least one magnetic sensor may include a first magnetic sensor, a second magnetic sensor, and a third magnetic sensor. The first magnetic sensor may be configured to detect a component of the target magnetic field in a first direction. The second magnetic sensor may be configured to detect a component of the target magnetic field in a second direction. The third magnetic sensor may be configured to detect a component of the target magnetic field in a third direction. The magnetic sensor device may further include a first chip including the first magnetic sensor, and a second chip including the second and third magnetic sensors. The first and second chips may be mounted on the reference plane, and arranged along a second reference direction orthogonal to the first reference direction. In such a case, the first direction may be a direction parallel to the reference plane. The second direction may be a direction oblique to both the reference plane and the first reference direction. The third direction may be another direction oblique to both the reference plane and the first reference direction.

A magnetic sensor system according to one embodiment of the technology includes the magnetic sensor device according to one embodiment of the technology, and a magnetic field generator that generates a predetermined magnetic field. The magnetic field generator is able to change its relative position with respect to the magnetic sensor device along a predetermined spherical surface.

A manufacturing method for the magnetic sensor device according to one embodiment of the technology includes a step of forming the at least one magnetic sensor, and a step of mounting the at least one magnetic sensor on the support. The step of forming the at least one magnetic sensor includes a step of forming the plurality of magnetoresistive elements. The step of forming the plurality of magnetoresistive elements includes a step of forming a plurality of initial magnetoresistive elements each including an initial magnetization pinned layer to later become the magnetization pinned layer, the free layer, and the gap layer, and a step of fixing a magnetization direction of the initial magnetization pinned layer using laser light and an external magnetic field.

In the magnetic sensor device and the magnetic sensor system according to one embodiment of the technology, the magnetization direction of the magnetization pinned layer and the magnetization direction of the free layer in each of the plurality of magnetoresistive elements are defined on the assumption that the center of gravity of the element layout area is deviated from the center of gravity of the reference plane. According to one embodiment of the technology, the influence of applied stress can thereby be reduced.

Other and further objects, features and advantages of the technology will appear more fully from the following description.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
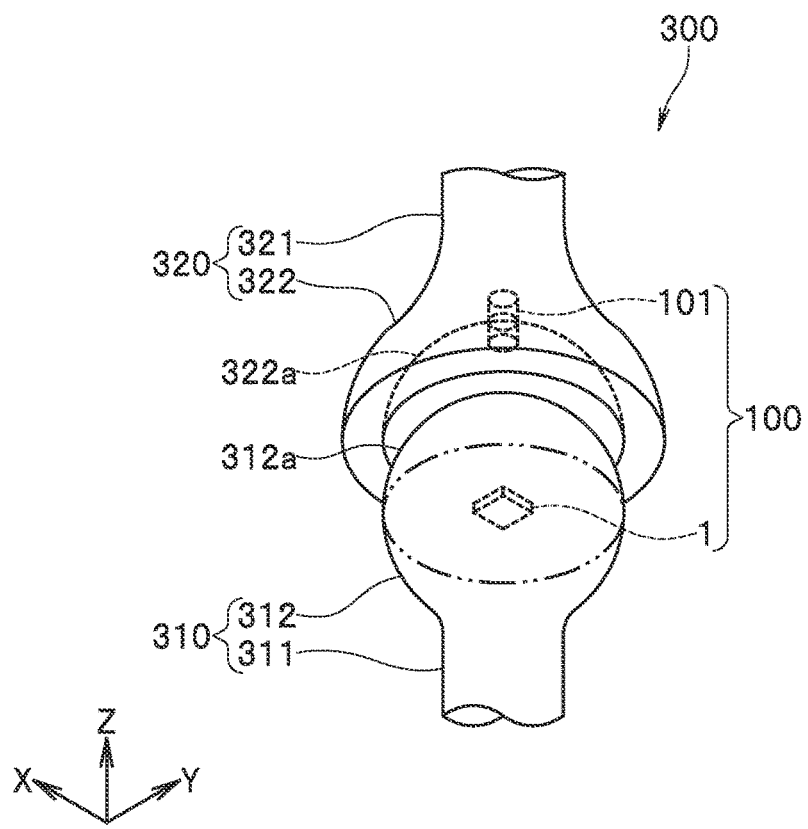
FIG. 1 is a perspective view showing a schematic configuration of a joint mechanism including a magnetic sensor system according to a first example embodiment of the technology.

An object of the technology is to provide a magnetic sensor device and a magnetic sensor system capable of reducing the effect of applied stress.

In the following, some example embodiments of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions.

First Example Embodiment

Figure 2:
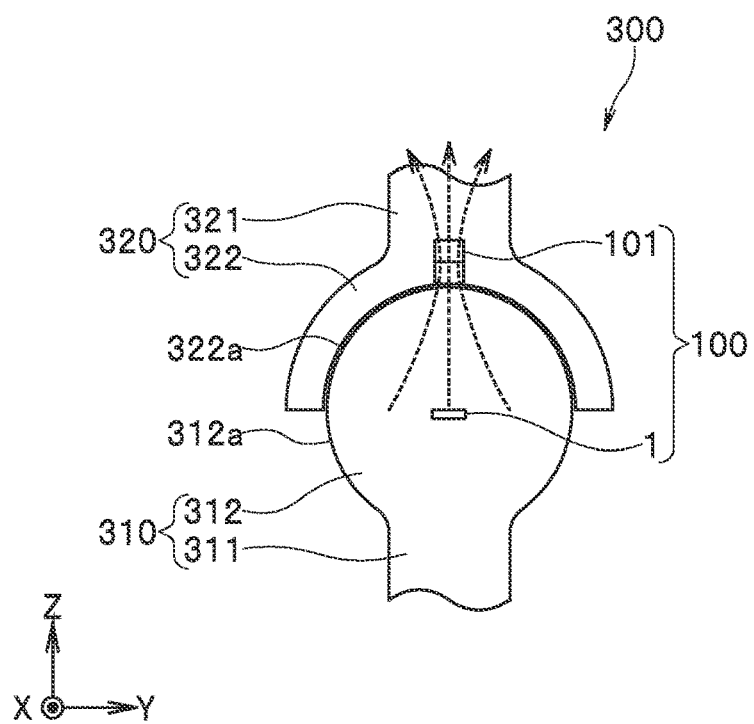
FIG. 2 is a sectional view showing the schematic configuration of the joint mechanism shown in FIG. 1.
Figure 3:
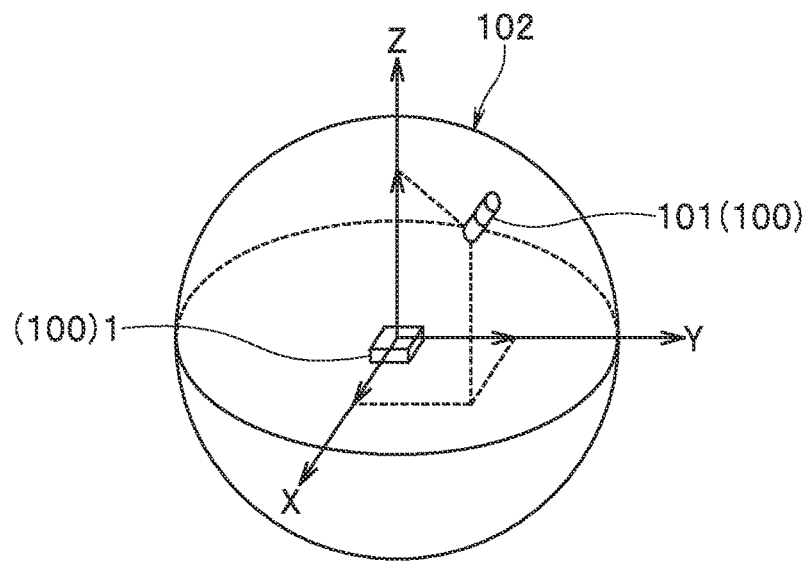
FIG. 3 is an explanatory view for describing a reference coordinate system in the magnetic sensor system according to the first example embodiment of the technology.

First, a joint mechanism 300 to which a magnetic sensor system 100 according to the first example embodiment of the technology is applied will be described. The joint mechanism 300 is a mechanism including a joint. FIG. 1 is a perspective view showing a schematic configuration of the joint mechanism 300. FIG. 2 is a sectional view showing the schematic configuration of the joint mechanism 300. FIG. 3 is an explanatory view for describing a reference coordinate system in the magnetic sensor system 100.

As shown in FIGS. 1 and 2, the joint mechanism 300 includes a first member 310, a second member 320, and the magnetic sensor system 100.

The first member 310 includes a shaft portion 311 and a spherical portion 312 coupled to one longitudinal end of the shaft portion 311. The spherical portion 312 includes a convex surface 312a. Here, a first spherical surface being a virtual spherical surface including the convex surface 312a is assumed. It can be said that the convex surface 312a is constituted of a part of the first spherical surface. A portion of the first spherical surface that is not included in the convex surface 312a is a border portion between the shaft portion 311 and the spherical portion 312.

The second member 320 includes a shaft portion 321 and a receptor portion 322 coupled to one longitudinal end of the shaft portion 321. The receptor portion 322 includes a concave surface 322a. Here, a second spherical surface being a virtual spherical surface including the concave surface 322a is assumed. It can be said that the concave surface 322a is constituted of a part of the second spherical surface. The concave surface 322a may be constituted of one half or almost one half of the second, spherical surface.

With the spherical portion 312 fitted into the receptor portion 322, the first member 310 and the second member 320 are coupled to each other such that their positional relationship is changeable. The second spherical surface has a radius slightly greater than or equal to that of the first spherical surface. The convex surface 312a and the concave surface 322a may be in contact with each other, or opposed to each other with a lubricant therebetween. The center of the second spherical surface coincides or almost coincides with that of the first spherical surface. The coupling portion between the first and second members 310 and 320 is the joint. In the present example embodiment, the joint is a ball-and-socket joint.

The magnetic sensor system 100 includes a magnetic sensor device 1 and a magnetic field generator 101. The magnetic field generator 101 is able to change its relative position with respect to the magnetic sensor device 1 along a predetermined spherical surface. The magnetic sensor system 100 is a device for detecting the relative position of the magnetic field generator 101 with respect to the magnetic sensor device 1.

The magnetic field generator 101 generates a predetermined magnetic field. An example of the magnetic field generator 101 is a magnet. The magnetic sensor device 1 generates a first detection value, a second detection value, and a third detection value that have correspondences with components in three mutually different directions of a magnetic field at a reference position. The reference position will be described in detail later.

As shown in FIGS. 1 and 2, the magnetic field generator 101 is embedded in the receptor portion 322 so as not to protrude from the concave surface 32. The magnetic sensor device 1 is located inside the spherical portion 312. Hereinafter, the position of the center of the first spherical surface will be referred to as a reference position. The magnetic sensor device 1 is configured to detect a magnetic field at the reference position.

Hereinafter, a magnetic field that is a portion of the magnetic field generated by the magnetic field generator 101 and that is at the reference position will be referred to as a target magnetic field. For example, the direction of the target magnetic field is parallel to a virtual straight line passing through the reference position and the magnetic field generator 101. In the example shown in FIG. 2, the magnetic field generator 101 is a magnet having an N pole and an S pole arranged along the foregoing virtual straight line. The S pole is located closer to the reference position than the N pole is. The plurality of arrowed broken lines in FIG. 2 represent magnetic lines of force corresponding to the magnetic field generated by the magnetic field generator 101.

The joint mechanism 300 shown in FIGS. 1 and 2 is able to change the relative position of the second member 320 with respect to the first member 310, with the spherical portion 312 fitted into the receptor portion 322. This allows the magnetic field generator 101 to be able to change its relative position with respect to the magnetic sensor device 1 along the foregoing predetermined spherical surface. In the present example embodiment, the relative position of the magnetic field generator 101 with respect to the magnetic sensor device 1 is represented by the position of a point closest to the reference position on the magnetic field generator 101. The center of the predetermined spherical surface coincides or almost coincides with the center of the first spherical surface. The predetermined spherical surface has a radius greater than or equal to that of the first spherical surface. The radius of the predetermined spherical surface may coincide with that of the first spherical surface or that of the second spherical surface.

Now, a description will be given of a reference coordinate system in the present example embodiment with reference to FIG. 3. The reference coordinate system is an orthogonal coordinate system that is set with reference to the magnetic sensor device 1 and defined by three axes. An X direction, a Y direction, and a Z direction are defined in the reference coordinate system. As shown in FIG. 3, the X, Y, and Z directions are orthogonal to each other. The opposite directions to the X. Y, and Z directions will be expressed as −X, −Y, and −Z directions, respectively.

As described above, the magnetic sensor device 1 generates the first, second, and third detection values having correspondences with the components in three mutually different directions of the magnetic field at the reference position. In the present example embodiment, specifically, the three mutually different directions are a direction parallel to the X direction, a direction parallel to the Y direction, and a direction parallel to the Z direction. The three axes defining the reference coordinate system are an axis parallel to the X direction, an axis parallel to the Y direction, and an axis parallel to the Z direction.

The position of the magnetic sensor device 1 in the reference coordinate system remains unchanged. As the relative position of the magnetic field generator 101 with respect to the magnetic sensor device 1 changes, the position of the magnetic field generator 101 in the reference coordinate system changes along the foregoing predetermined spherical surface. In FIG. 3, the reference numeral 102 designates the predetermined spherical surface. The position of the magnetic field generator 101 in the reference coordinate system indicates the relative position of the magnetic field generator 101 with respect to the magnetic sensor device 1. Hereinafter, the position of the magnetic field generator 101 in the reference coordinate system will be simply referred to as the position of the magnetic field generator 101.

In the joint mechanism 300 including the magnetic sensor system 100, the magnetic sensor system 100 detects the relative position of the magnetic field generator 101 with respect to the magnetic sensor device 1, thereby enabling detection of the relative position of the second member 320 with respect to the first member 310. The joint mechanism 30 may be used for robots, industrial equipment, medical equipment, amusement equipment, etc.

The magnetic sensor system 100 is applicable not only to the joint mechanism 300 but also to joysticks and trackballs.

A joystick includes, for example, a lever and a support that swingably supports the lever. In the case of applying the magnetic sensor system 100 to the joystick, for example, the magnetic field generator 101 is provided inside the support and the magnetic sensor device 1 is provided inside the lever so that the relative position of the magnetic field generator 101 with respect to the magnetic sensor device 1 changes along a predetermined spherical surface as the lever swings.

A trackball includes, for example, a ball and a support that rotatably supports the ball. In the case of applying the magnetic sensor system 100 to the trackball, for example, the magnetic field generator 101 is provided inside the support and the magnetic sensor device 1 is provided inside the ball so that the relative position of the magnetic field generator 101 with respect to the magnetic sensor device 1 changes along a predetermined spherical surface as the ball rotates.

Figure 4:
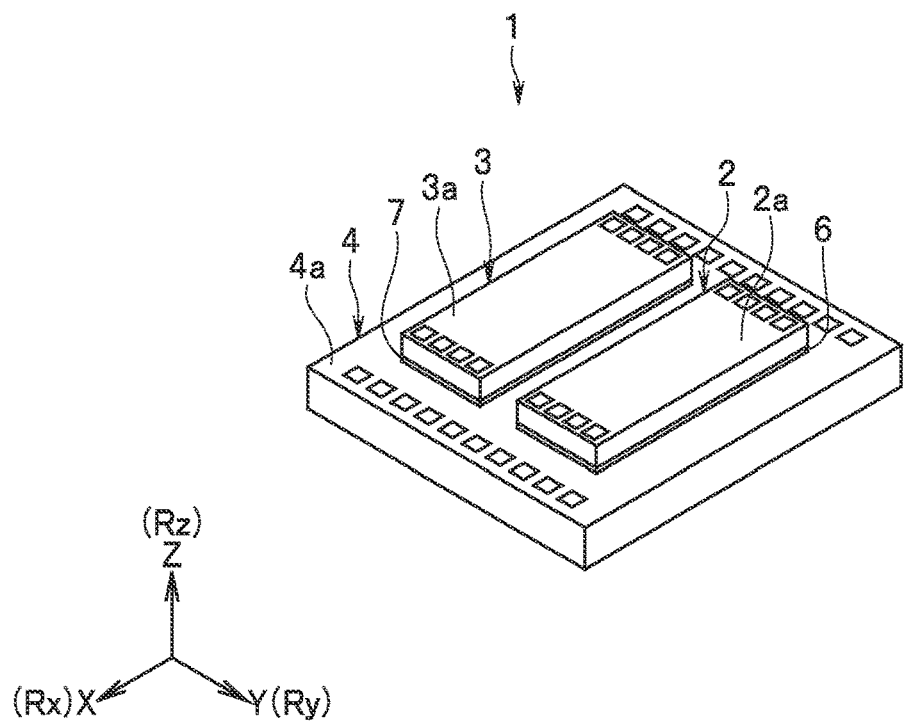
FIG. 4 is a perspective view showing a magnetic sensor device according to the first example embodiment of the technology.
Figure 5:
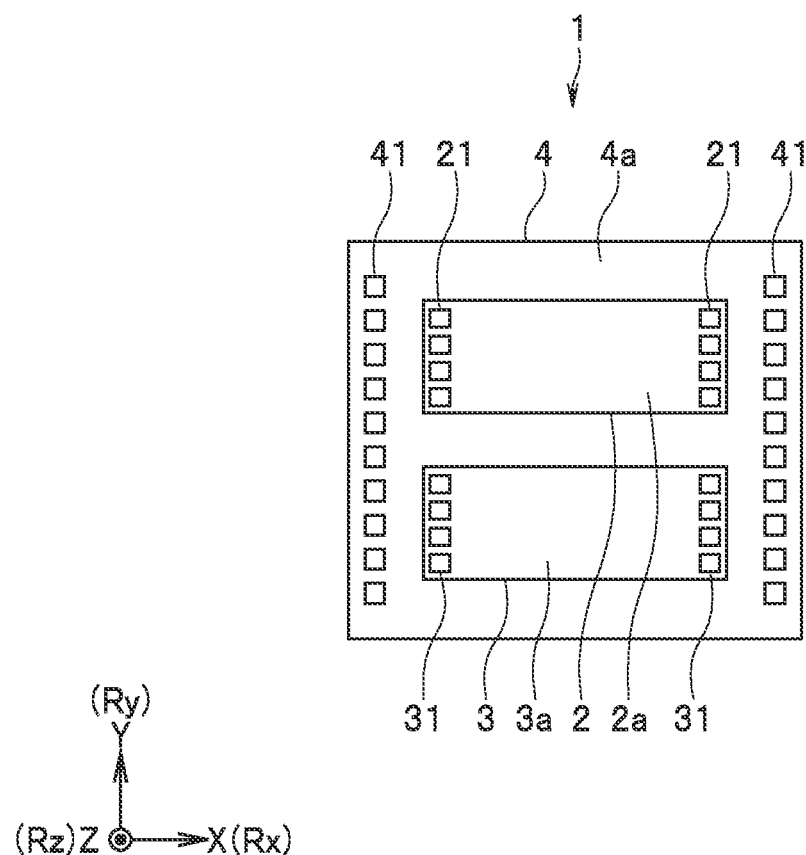
FIG. 5 is a plan view showing the magnetic sensor device according to the first example embodiment of the technology.
Figure 6:
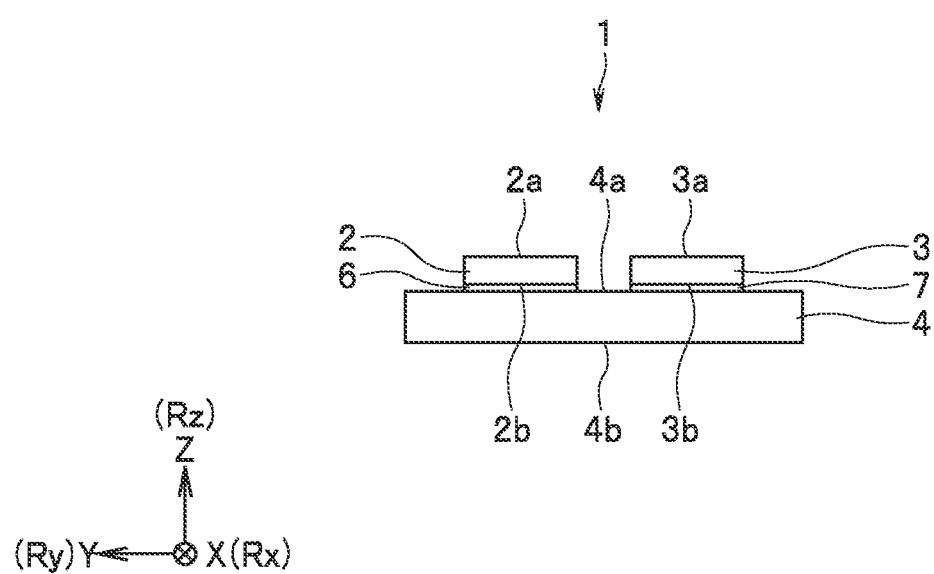
FIG. 6 is a side view showing the magnetic sensor device according to the first example embodiment of the technology.
Figure 7:
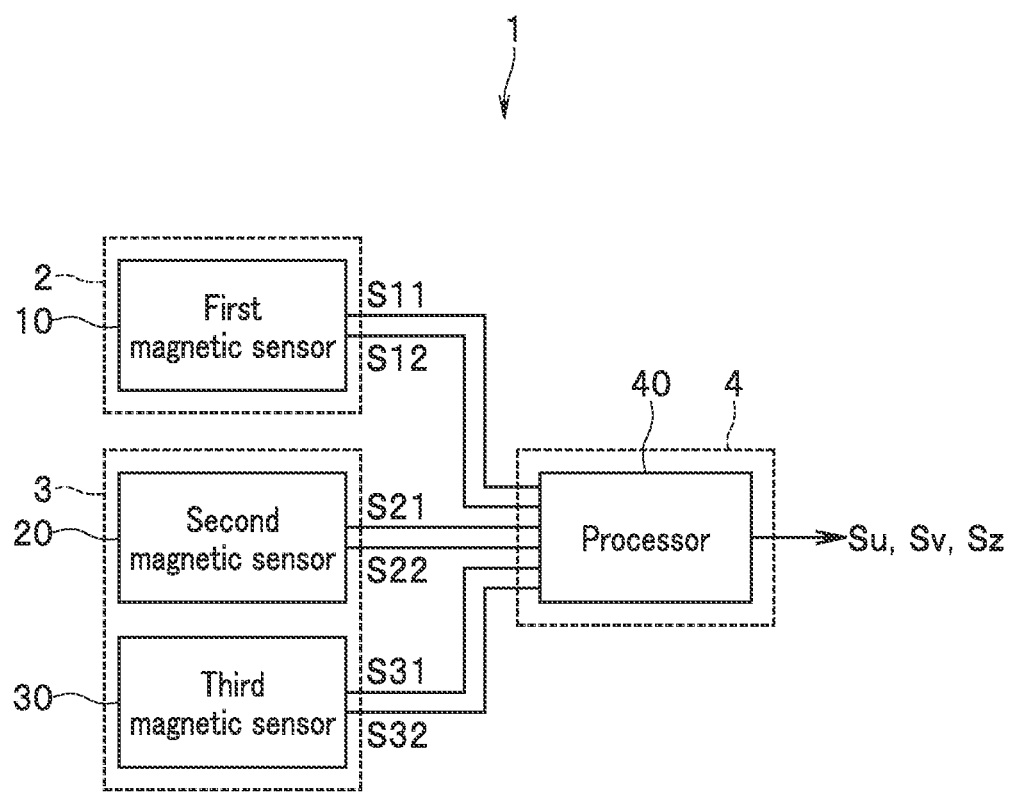
FIG. 7 is a functional block diagram showing a configuration of the magnetic sensor device according to the first example embodiment of the technology.

Next, the configuration of the magnetic sensor device 1 will be described with reference to FIGS. 4 to 7. FIG. 4 is a perspective view showing the magnetic sensor device 1. FIG. 5 is a plan view showing the magnetic sensor device 1. FIG. 6 is a side view showing the magnetic sensor device 1. FIG. 7 is a functional block diagram showing the configuration of the magnetic sensor device 1.

The magnetic sensor device 1 includes at least one magnetic sensor and a support, that supports the at least one magnetic sensor. The at least one magnetic sensor includes a plurality of magnetoresistive elements and is configured to detect a target magnetic field that is a magnetic field to be detected. The magnetoresistive elements will hereinafter be referred to as MR elements.

In the present example embodiment, the at least one magnetic sensor includes a first magnetic sensor 10, a second magnetic sensor 20, and a third magnetic sensor 30. Each of the first to third magnetic sensors 10, 20, and 30 includes a plurality of MR elements. The magnetic sensor device 1 includes a first chip 2 including the first magnetic sensor 10, and a second chip 3 including the second magnetic sensor 20 and the third magnetic sensor 30. Both the first and second chips 2 and 3 have a rectangular solid shape.

The support 4 has a rectangular solid shape. The support 4 has a reference plane 4a that is a top surface, a bottom surface 4b located opposite to the reference plane 4a, and four side surfaces connecting the reference plane 4a and the bottom surface 4b.

Now, a relationship of the components of the magnetic sensor device 1 with the reference coordinate system will be described with reference to FIGS. 4 to 6. As described above, the X, Y, Z, −Y, and −Z directions are defined in the reference coordinate system. The X and Y directions are parallel to the reference plane 4a of the support 4. The Z direction is perpendicular to the reference plane 4a of the support 4, and directed from the bottom surface 4b to the reference plane 4a of the support 4. Hereinafter, the term "above" refers to positions located forward of a reference position in the Z direction, and "below" refers to positions opposite from the "above" positions with respect to the reference position. For each component of the magnetic sensor device 1, the term "top surface" refers to a surface of the component lying at the end thereof in the Z direction, and "bottom surface" refers to a surface of the component lying at the end thereof in the −Z direction.

A direction perpendicular to the reference plane 4a (direction parallel to the Z direction) will be referred to as a first reference direction. Two directions orthogonal to the first reference direction will be referred to as a second reference direction and a third reference direction. In the present example embodiment, a direction parallel to the Y direction is referred to as the second reference direction. A direction parallel to the X direction is referred to as the third reference direction. The first reference direction will hereinafter be denoted by the symbol Rz, the second reference direction by the symbol Ry, and the third reference direction by the symbol Rx.

The first chip 2 has a top surface 2a and a bottom surface 2b positioned opposite to each other, and four side surfaces connecting the top surface 2a and the bottom surface 2b. The second chip 3 has a top surface 3a and a bottom surface 3b positioned opposite to each other, and four side surfaces connecting the top surface 3a and the bottom surface 3b.

The first chip 2 is mounted on the reference plane 4a in a posture such that the bottom surface 2b faces the reference plane 4a of the support 4. The second chip 3 is mounted on the reference plane 4a in a posture such that the bottom surface 3b faces the reference plane 4a of the support 4. The first chip 2 and the second chip 3 are bonded to the support 4 with, for example, adhesives 6 and 7, respectively.

The first chip 2 has a plurality of first pads (electrode pads) 21 disposed on the top surface 2a. The second chip 3 has a plurality of second pads (electrode pads) 31 disposed on the top surface 3a. The support 4 has a plurality of third pads (electrode pads) 41 disposed on the reference plane 4a. Although not shown, in the magnetic sensor device 1, among the plurality of first pads 21, the plurality of second pads 31, and the plurality of third pads 41, corresponding pairs are connected with bonding wires.

The support 4 includes a processor 40 configured to process a plurality of detection signals generated by the first to third magnetic sensors 10, 20, and 30. For example, the processor 40 is constructed of an application-specific integrated circuit (ASIC). The first to third magnetic sensors 10, 20, and 30 are connected to the processor 40 through pads 21, 31, and 41 and the plurality of bonding wires.

A dimension in a direction perpendicular to the reference plane 4a is referred to as thickness. As shown in FIG. 6, the thickness of the first chip 2 and the thickness of the second chip 3 are the same. The thickness of the support 4 is greater than the thickness of the first chip 2 and the thickness of the second chip 3.

Figure 8:
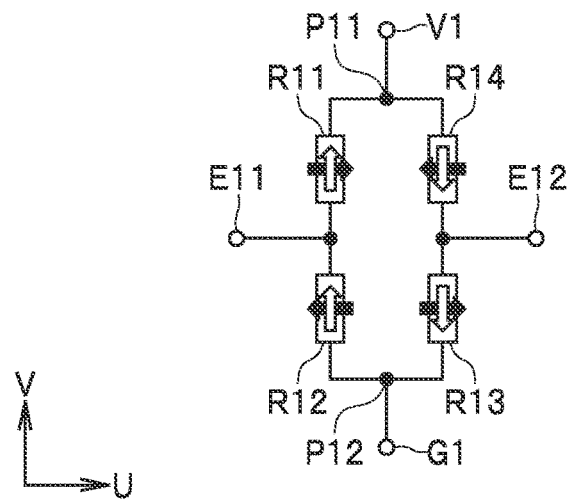
FIG. 8 is a circuit diagram showing a circuit configuration of a first magnetic sensor of the first example embodiment of the technology.
Figure 9:
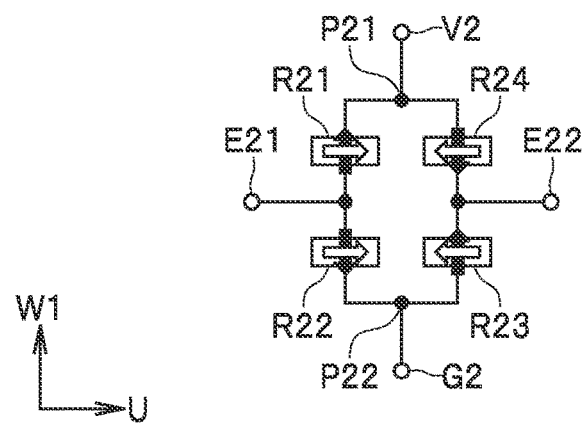
FIG. 9 is a circuit diagram showing a circuit configuration of a second magnetic sensor of the first example embodiment of the technology.
Figure 10:
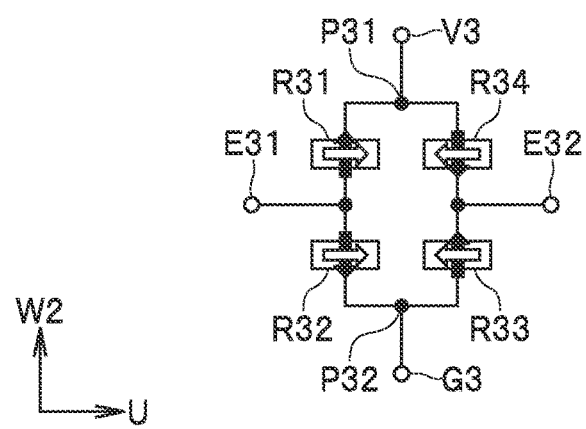
FIG. 10 is a circuit diagram showing a circuit configuration of a third magnetic sensor of the first example embodiment of the technology.
Figure 11:
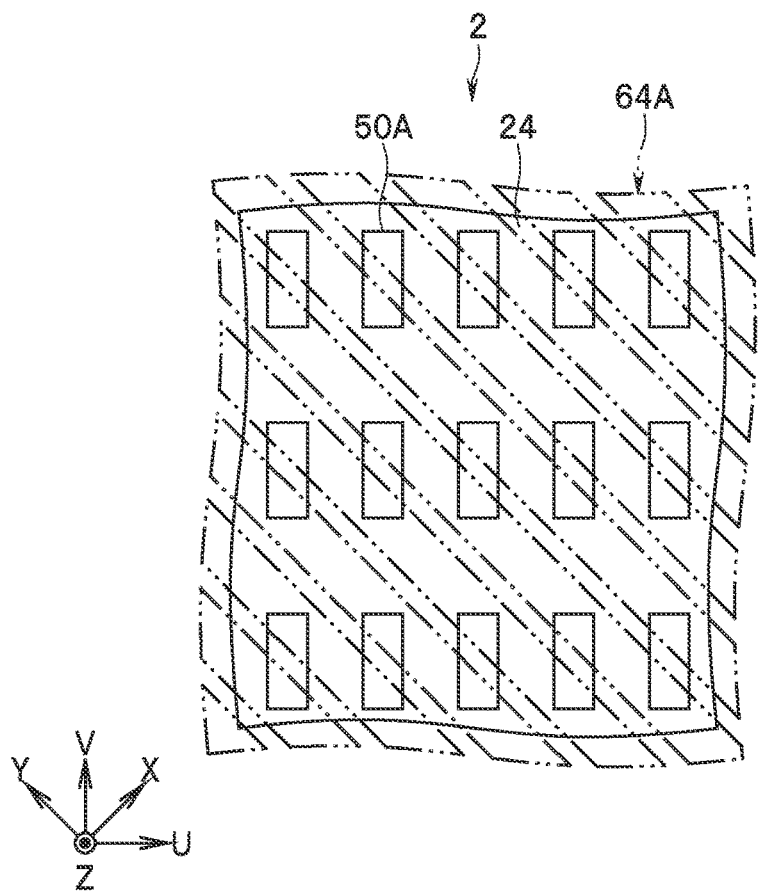
FIG. 11 is a plan view showing a part of a first chip of the first example embodiment of the technology.
Figure 12:
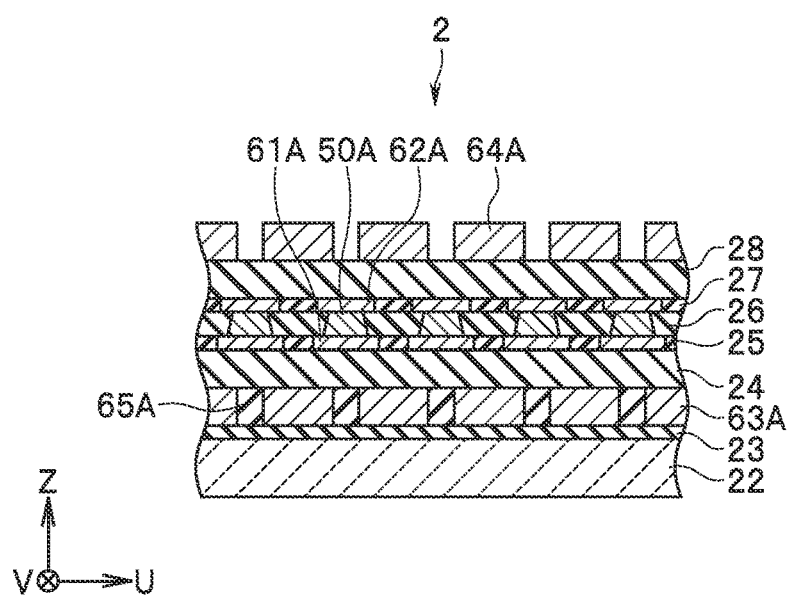
FIG. 12 is a sectional view showing a part of the first chip of the first example embodiment of the technology.
Figure 13:
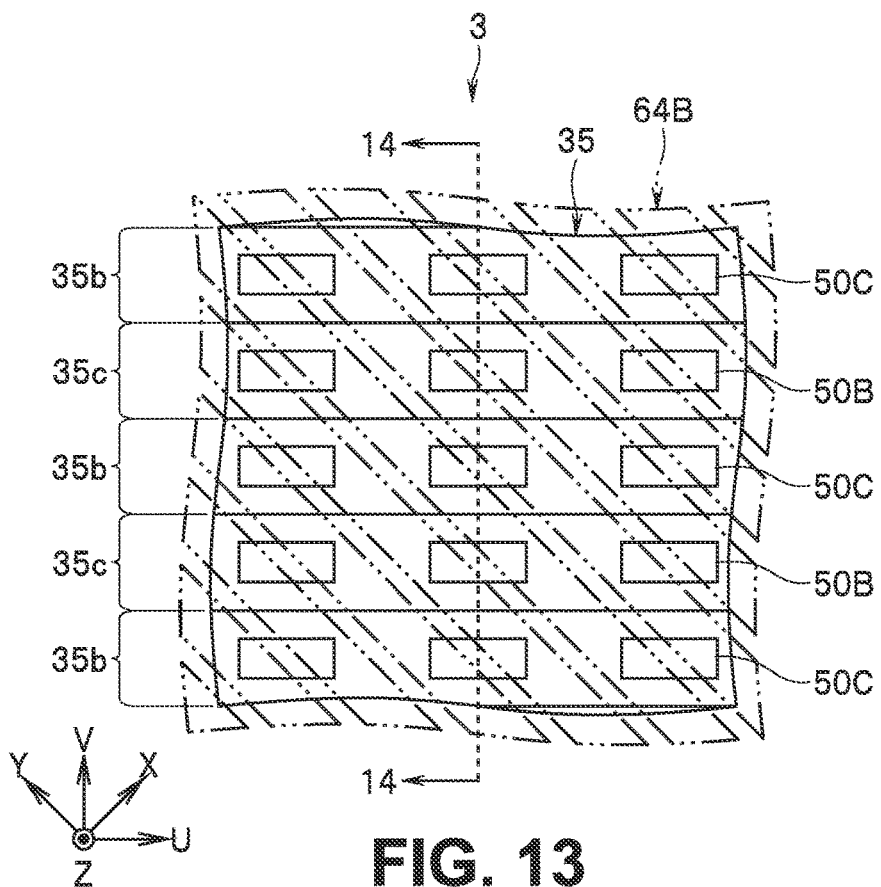
FIG. 13 is a plan view showing a part of a second chip of the first example embodiment of the technology.
Figure 14:
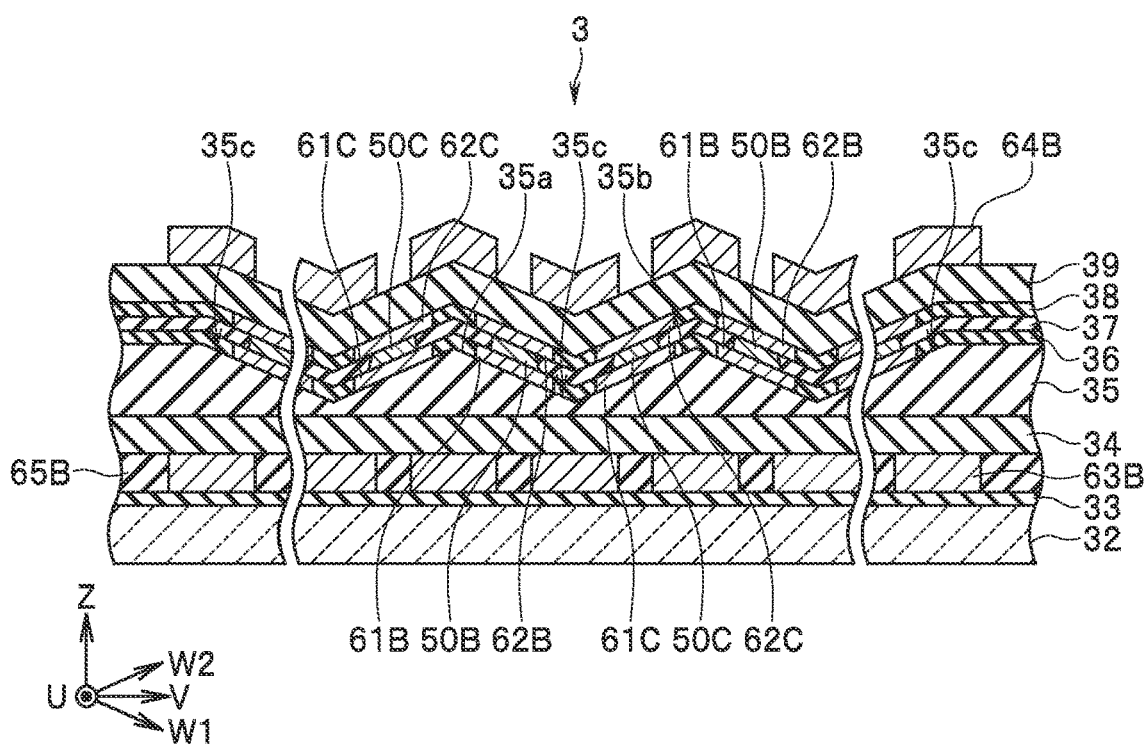
FIG. 14 is a sectional view showing a part of the second chip of the first example embodiment of the technology.

Next, referring to FIGS. 8 to 14, the configuration of the first to third magnetic sensors 10, 20, and 30 will be described. FIG. 8 is a circuit diagram showing the circuit configuration of the first magnetic sensor 10. FIG. 9 is a circuit diagram showing the circuit configuration of the second magnetic sensor 20. FIG. 10 is a circuit diagram showing the circuit configuration of the third magnetic sensor 30. FIG. 11 is a plan view showing a part of the first chip 2. FIG. 12 is a sectional view showing a part of the first chip 2. FIG. 13 is a plan view showing a part of the second chip 3. FIG. 14 is a sectional view showing a part of the second chip 3. FIG. 14 shows a part of the cross section at the position indicated by line 14-14 in FIG. 13.

Here, a first direction, a second direction, and a third direction are defined as follows. The first direction is a direction parallel to the reference plane 4a. The second direction is a direction oblique to both the reference plane 4a and the first reference direction Rz. The third direction is another direction oblique to both the reference plane 4a and the first reference direction Rz. The second direction is orthogonal to the first direction. The third direction is also orthogonal to the first direction too.

As shown in FIGS. 11 and 13, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. −U direction refers to a direction opposite to the U direction, and −V direction refers to a direction opposite to the V direction.

As shown in FIG. 14, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that is an angle greater than 0° and smaller than 90°. −W1 direction refers to a direction opposite to the W1 direction, and −W2 direction refers to a direction opposite to the W2 direction. Both the W1 direction and the W2 direction are orthogonal to the U direction.

In the present example embodiment, the first direction is a direction parallel to the U direction. The second direction is a direction parallel to the W1 direction. The third direction is a direction parallel to the W2 direction.

The first magnetic sensor 10 is configured to detect a first component of the target magnetic field and generate at least one first detection signal having a correspondence with the first component. The first component is a component of the target magnetic field in the first direction (direction parallel to the U direction).

The second magnetic sensor 20 is configured to detect a second component of the target magnetic field and generate at least one second detection signal having a correspondence with the second component. The second component is a component of the target magnetic field in the second direction (direction parallel to the W1 direction).

The third magnetic sensor 30 is configured to detect a third component of the target magnetic field and generate at least one third detection signal having a correspondence with the third component. The third component is a component of the target magnetic field in the third direction (direction parallel to the W2 direction).

As shown in FIG. 8, the first magnetic sensor 10 includes a power supply port V1, a ground port G1, signal output ports E11 and E12, a first resistor section R11, a second resistor section R12, a third resistor section R13, and a fourth resistor section R14. The plurality of MR elements of the first magnetic sensor 10 constitute the first to fourth resistor sections R11, R12, R13, and R14. The first and second resistor sections R11 and R12 are connected in series in a first path (left path in FIG. 8) that electrically connects a first connection point P11 and a second connection point P12. The third and fourth resistor sections R13 and R14 are connected in series in a second path (right path in FIG. 8) that electrically connects the first connection point P11 and the second connection point P12.

The first and fourth resistor sections R11 and R14 are connected to the first connection point P11. The second and third resistor sections R12 and R13 are connected to the second connection point P12. The first connection point P11 is connected to the power supply port V1. The second connection point P12 is connected to the ground port G1. The connection point between the first resistor section R11 and the second resistor section R12 is connected to the signal output port E11. The connection point between the third resistor section R13 and the fourth resistor section R14 is connected to the signal output port E12.

As shown in FIG. 9, the second magnetic sensor 20 includes a power supply port V2, a ground port G2, signal output ports E21 and E22, a first resistor section R21, a second resistor section R22, a third resistor section R23, and a fourth resistor section R24. The plurality of MR elements of the second magnetic sensor 20 constitute the first to fourth resistor sections R21, R22, R23, and R24.

The second magnetic sensor 20 has basically the same circuit configuration as that of the first magnetic sensor 10. The description of the circuit configuration of the first magnetic sensor 10 applies to the circuit configuration of the second magnetic sensor 20 if the power supply port V1, the ground port G1, the signal output ports E11 and E12, the resistor sections R11, R12, R13, and R14, and the connection points P11 and P12 in the description are replaced with a power supply port V2, a ground port G2, signal output ports E21 and E22, resistor sections R21, R22, R23, and R24, and connection points P21 and P22, respectively.

As shown in FIG. 10, the third magnetic sensor 30 includes a power supply port V3, a ground port G3, signal output ports E31 and E32, a first resistor section R31, a second resistor section R32, a third resistor section R33, and a fourth resistor section R34. The plurality of MR elements of the third magnetic sensor 30 constitute the first to fourth resistor sections R31, R32, R33, and R34.

The third magnetic sensor 30 has basically the same circuit configuration as that of the first magnetic sensor 10. The description of the circuit configuration of the first magnetic sensor 10 applies to the circuit configuration of the third magnetic sensor 30 if the power supply port V1, the ground port G1, the signal output ports E11 and E12, the resistor sections R11, R12, R13, and R14, and the connection points P11 and P12 in the description are replaced with a power supply port V3, a ground port G3, signal output ports E31 and E32, resistor sections R31, R32, R33, and R34, and connection points P31 and P32, respectively.

The plurality of MR elements of the first magnetic sensor 10 will hereinafter be referred to as a plurality of first MR elements 50A, the plurality of MR elements of the second magnetic sensor 20 a plurality of second MR elements 50B, and the plurality of MR elements of the third magnetic sensor 30 a plurality of third MR elements 50C. Any given MR element will be denoted by the reference numeral 50.

Figure 15:
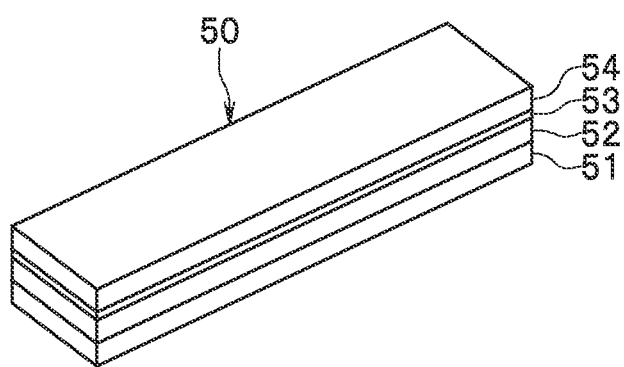
FIG. 15 is a perspective view showing a magnetoresistive element of the first example embodiment of the technology.

FIG. 15 is a perspective view showing an MR element 50. The MR element 50 is a spin-valve MR element. The MR element 50 includes a magnetization pinned layer 52 having magnetization whose direction is fixed, a free layer 54 having magnetization whose direction is variable depending on the direction of an external magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 15.

In FIGS. 8 to 10, the solid arrows represent the magnetization directions of the magnetization pinned layers 52 of the MR elements 50. The hollow arrows represent the magnetization directions of the free layers 54 of the MR elements 50 when the target magnetic field is not applied to the MR elements 50.

A first magnetization direction, a second magnetization direction, a third magnetization direction, and a fourth magnetization direction will be defined as follows. The first magnetization direction is a direction intersecting the first reference direction Rz. The second magnetization direction is a direction intersecting the first reference direction Rz and opposite to the first magnetization direction. The third magnetization direction is a direction intersecting the first reference direction Rz and orthogonal to the first magnetization direction. The fourth magnetization direction is a direction intersecting the first reference direction Rz and opposite to the third magnetization direction.

In the present example embodiment, the first magnetization direction intersects the second reference direction Ry. The angle that the first magnetization direction forms with respect to the second reference direction Ry may be in the range greater than 0° and less than 90°.

In the first magnetic sensor 10, the first magnetization direction is the U direction, the second magnetization direction is the −U direction, the third magnetization direction is the V direction, and the fourth magnetization direction is the −V direction. In the example shown in FIG. 8, the magnetization of the magnetization pinned layer 52 in each of the first and third resistor sections R11 and R13 includes a component in the first magnetization direction (U direction). The magnetization of the magnetization pinned layer 52 in each of the second and fourth resistor sections R12 and R14 includes a component in the second magnetization direction (−U direction).

The magnetization of the free layer 54 in each of two of the first to fourth resistor sections R11, R12, R13, and R14 includes a component in the third magnetization direction (V direction) when the target magnetic field is not applied to the first magnetic sensor 10. The magnetization of the free layer 54 in each of the other two of the first to fourth resistor sections R11, R12, R13, and R14 includes a component in the fourth magnetization direction (−V direction) when the target magnetic field is not applied to the first magnetic sensor 10. In the example shown in FIG. 8, the magnetization of the free layer 54 in each of the first and second resistor sections R11 and R12 includes a component in the third magnetization direction (V direction) in the foregoing case. The magnetization of the free layer 54 in each of the third and fourth resistor sections R13 and R14 includes a component in the fourth magnetization direction (−V direction) in the foregoing case.

If the magnetization of a magnetization pinned layer 52 includes a component in a specific magnetization direction, the component in the specific magnetization direction may be the main component of the magnetization of the magnetization pinned layer 52. Alternatively, the magnetization of the magnetization pinned layer 52 may be free of a component in the direction orthogonal to the specific magnetization direction. In the present example embodiment, if the magnetization of a magnetization pinned layer 52 includes a component in a specific magnetization direction, the magnetization direction of the magnetization pinned layer 52 is the same or substantially the same as the specific magnetization direction.

Similarly, if the magnetization of a free layer 54 when the target magnetic field is not applied to the free layer 54 includes a component in a specific magnetization direction, the component in the specific magnetization direction may be the main component of the magnetization of the free layer 54. Alternatively, the magnetization of the free layer 54 in the foregoing case may be free of a component in a direction orthogonal to the specific magnetization direction. In the present example embodiment, if the magnetization of the free layer 54 in the foregoing case includes a component in a specific magnetization direction, the magnetization direction of the free layer 54 in the foregoing case is the same or substantially the same as the specific magnetization direction.

The first magnetic sensor 10 is configured so that the free layers 54 are magnetized in the foregoing respective directions when the target magnetic field is not applied to the first magnetic sensor 10. Specifically, the free layer 54 in each of the plurality of first MR elements 50A of the first magnetic sensor 10 has a shape anisotropy that sets the direction of the magnetization easy axis to a direction parallel to the third magnetization direction (V direction). The direction parallel to the third magnetization direction (V direction) is also parallel to the fourth magnetization direction (-V direction).

The first magnetic sensor 10 also includes the magnetic field generator configured to apply to the free layers 54 a magnetic field in a direction intersecting each of the first to fourth magnetization directions. In the present example embodiment, the magnetic field generator includes a coil. The specific direction of the magnetic field generated by the coil will be described later.

In the second magnetic sensor 20, the first magnetization direction is the W1 direction, the second magnetization direction is the -W1 direction, the third magnetization direction is the U direction, and the fourth magnetization direction is the -U direction. The description of the magnetization directions of the magnetization pinned layers 52 and the magnetization directions of the free layers 54 in the first magnetic sensor 10 applies to the magnetization directions of the magnetization pinned layers 52 and the magnetization directions of the free layers 54 in the second magnetic sensor 20 if the first magnetic sensor 10, the resistor sections R11, R12, R13, and R14, the U direction, the -U direction, the V direction, and the -V direction in the description are replaced with the second magnetic sensor 20, the resistor sections R21, R22, R23, and R24, the W1 direction, the -W1 direction, the U direction, and the -U direction, respectively.

In the third magnetic sensor 30, the first magnetization direction is the W2 direction, the second magnetization direction is the -W2 direction, the third magnetization direction is the U direction, and the fourth magnetization direction is the -U direction. The description of the magnetization directions of the magnetization pinned layers 52 and the magnetization directions of the free layers 54 in the first magnetic sensor 10 applies to the magnetization directions of the magnetization pinned layers 52 and the magnetization directions of the free layers 54 in the third magnetic sensor 30 if the first magnetic sensor 10, the resistor sections R11, R12, R13, and R14, the U direction, the -U direction, the V direction, and the -V direction in the description are replaced with the third magnetic sensor 30, the resistor sections R31, R32, R33, and R34, the W2 direction, the -W2 direction, the U direction, and the -U direction, respectively.

As shown in FIGS. 11 and 12, the first chip 2 includes a substrate 22, insulating layers 23, 24, 25, 26, 27, 28, and 65A, a plurality of lower electrodes 61A, a plurality of upper electrodes 62A, a plurality of lower coil elements 63A, and a plurality of upper coil elements 64A. The coil elements are a part of the coil winding. The insulating layer 23 is disposed on the substrate 22. The plurality of lower coil elements 63A are disposed on the insulating layer 23. The insulating layer 65A is disposed around the lower coil elements 63A on the insulating layer 23. The insulating layer 24 is disposed on the plurality of lower coil elements 63A and the insulating layer 65A. The plurality of lower electrodes 61A are disposed on the insulating layer 24. The insulating layer 25 is disposed around the lower electrodes 61A on the insulating layer 24.

The plurality of first MR elements 50A are disposed on the plurality of lower electrodes 61A. The insulating layer 26 is disposed around the first MR elements 50A on the lower electrodes 61A and the insulating layer 25. The plurality of upper electrodes 62A are disposed on the plurality of first MR elements 50A and the insulating layer 26. The insulating layer 27 is disposed around the upper electrodes 62A on the insulating layer 26. The insulating layer 28 is disposed on the plurality of upper electrodes 62A and the insulating layer 27. The plurality of upper coil elements 64A are disposed on the insulating layer 28. The first chip 2 may further include a not-shown insulating layer that covers the plurality of upper coil elements 64A and the insulating layer 28. In FIG. 11, the plurality of lower electrodes 61A, the plurality of upper electrodes 62A, the plurality of lower coil elements 63A, and the insulating layers 23 to 28 and 65A are omitted.

In the state of mounting the first chip 2 on the reference plane 4a of the support 4 (refer to FIGS. 4 to 6), a top surface of the substrate 22 is parallel to the reference plane 4a. In the foregoing state, a top surface of each of the plurality of lower electrodes 61A is also parallel to the reference plane 4a. Thus, it can be said that, in the foregoing state, the plurality of first MR elements 50A are disposed on a flat surface parallel to the reference plane 4a.

As shown in FIG. 11, the plurality of first MR elements 50A are disposed so that two or more MR elements 50A are arranged both in the U direction and in the V direction. Each of the plurality of upper coil elements 64A extends in a direction parallel to the Y direction. The plurality of upper coil elements 64A are arranged in the X direction. When seen in the first reference direction Rz, two upper coil elements 64A overlap each of the plurality of first MR elements 50A. Although not shown in the drawings, the shape and arrangement of the plurality of lower coil elements 63A may be the same as or different from those of the plurality of upper coil elements 64A.

In the example shown in FIGS. 11 and 12, the plurality of lower coil elements 63A and the plurality of upper coil elements 64A are electrically connected, to constitute a coil that applies a magnetic field in the X direction and a magnetic field in the -X direction to the free layers 54 in the plurality of first MR elements 50A. The coil is configured so that the magnetic field in the X direction can be applied to either of the free layers 54 in each of the first and second resistor sections R11 and R12 or the free layers 54 in each of the third and fourth resistor sections R13 and R14, and the magnetic field in the -X direction can be applied to the other of the free layers 54.

The directions of the magnetic fields generated by the coil and applied to the free layers 54 intersect each of the first to fourth magnetization directions (U direction, -U direction, V direction, and -V direction) of the first magnetic sensor 10. In particular, in the example shown in FIGS. 11 and 12, the directions of the magnetic fields applied to the free layers 54 are oblique at 45° with respect to both the direction parallel to the first magnetization direction (U direction) and the direction parallel to the third magnetization direction (V direction).

Each lower electrode 61A has a long slender shape. Two lower electrodes 61A adjoining in the longitudinal direction of the lower electrodes 61A have a gap therebetween. First MR elements 50A are disposed near both longitudinal ends on the top surface of each lower electrode 61A. Each upper electrode 62A has a long slender shape, and electrically connects two adjoining first MR elements 50A that are disposed on two lower electrodes 61A adjoining in the longitudinal direction of the lower electrodes 61A.

As shown in FIGS. 13 and 14, the second chip 3 includes a substrate 32, insulating layers 33, 34, 35, 36, 37, 38, 39, and 65B, a plurality of lower electrodes 61B, a plurality of lower electrodes 61C, a plurality of upper electrode 62B, a plurality of upper electrodes 62C, a plurality of lower coil elements 63B, and a plurality of upper coil elements 64B. The insulating layer 33 is disposed on the substrate 32. The plurality of lower coil elements 63B are disposed on the insulating layer 33. The insulating layer 65B is disposed around the lower coil elements 63B on the insulating layer 33. The insulating layer 34 is disposed on the lower coil elements 63B and the insulating layer 65B. The insulating layer 35 is disposed on the substrate 34. The plurality of lower electrodes 61B and the plurality of lower electrodes 61C are disposed on the insulating layer 35. The insulating layer 36 is disposed around the lower electrodes 61B and the lower electrodes 61C on the insulating layer 35.

The plurality of second MR elements 50B are disposed on the plurality of lower electrodes 61B. The plurality of third MR elements 50C are disposed on the plurality of lower electrodes 61C. The insulating layer 37 is disposed around the second MR elements 50B and the third MR elements 50C on the lower electrodes 61B, the lower electrodes 61C, and the insulating layer 36. The plurality of upper electrodes 62B are disposed on the plurality of second MR elements 50B and the insulating layer 37. The insulating layer 38 is disposed around the plurality of upper electrodes 62B and the plurality of upper electrodes 62C on the insulating layer 37. The plurality of upper electrodes 62C are disposed on the plurality of third MR elements 50C and the insulating layer 37. The insulating layer 39 is disposed on the plurality of upper electrodes 62B, the plurality of upper electrodes 62C, and the insulating layer 38. The plurality of upper coil elements 64B are disposed on the insulating layer 39. The second chip 3 may further include a not-shown insulating layer that covers the plurality of upper coil elements 64B and the insulating layer 39. In FIG. 13, the plurality of lower electrodes 61B, the plurality of lower electrodes 61C, the plurality of upper electrodes 62B, the plurality of upper electrodes 62C, the plurality of lower coil elements 63B, and the insulating layers 33 to 39 are omitted.

In the state of mounting the second chip 3 on the reference plane 4a of the support 4 (refer to FIGS. 4 to 6), a top surface of the substrate 32 is parallel to the reference plane 4a. The insulating layer 35 has a plurality of groove sections 35c. Each of the plurality of groove sections 35c has an inclined surface 35a and an inclined surface 35b that are inclined with respect to the top surface of the substrate 32. The plurality of lower electrodes 61B are disposed on each of the inclined surfaces 35a of the plurality of groove sections 35c. The plurality of lower electrodes 61C are disposed on each of the inclined surfaces 35b of the plurality of the groove sections 35c. In the foregoing state, a top surface of each of the plurality of lower electrodes 61B and a top surface of each of the plurality of lower electrodes 61C are also inclined with respect to the reference plane 4a. Thus, it can be said that, in the foregoing state, the plurality of second MR elements 50B and the plurality of third MR elements 50C are disposed on inclined surfaces that are inclined with respect to the reference plane 4a.

As shown in FIG. 13, the plurality of second MR elements 50B are disposed so that two or more MR elements 50B are arranged both in the U direction and in the V direction. Similarly, the plurality of third MR elements 50C are disposed so that two or more MR elements 50C are arranged both in the U direction and in the V direction. In the present example embodiment, the second MR elements 50B and the third MR elements 50C are alternately arranged in the V direction.

Each of the plurality of upper coil elements 64B extends in a direction parallel to the Y direction. The plurality of upper coil elements 64B are arranged in the X direction. When seen in the first reference direction Rz, two upper coil elements 64B overlap each of the plurality of second MR elements 50B and the plurality of third MR elements 50C. Although not shown in the drawings, the shape and arrangement of the plurality of lower coil elements 63B may be the same as or different from those of the plurality of upper coil elements 64B.

In the example shown in FIGS. 13 and 14, the plurality of lower coil elements 63B and the plurality of upper coil elements 64B are electrically connected, to constitute a coil that applies a magnetic field in the X direction and a magnetic field in the −X direction to the free layers 54 in the plurality of second MR elements 50B and the free layers 54 in the plurality of third MR elements 50C. The coil is configured so that the magnetic field in the X direction can be applied to either of the free layers 54 in each of the first and second resistor sections R21 and R22 of the second magnetic sensor 20 and the first and second resistor sections R31 and R32 of the third magnetic sensor 30 or the free layers 54 in each of the third and fourth resistor sections R23 and R24 of the second magnetic sensor 20 and the third and fourth resistor sections R33 and R34 of the third magnetic sensor 30, and the magnetic field in the −X direction can be applied to the other of the free layers 54.

The directions of the magnetic fields generated by the coil and applied to the free layers 54 in the second magnetic sensor 20 intersect each of the first to fourth magnetization directions (W1 direction, −W1 direction, U direction, and −U direction) of the second magnetic sensor 20. In particular, in the example shown in FIGS. 13 and 14, the directions of the magnetic fields applied to the free layers 54 in the second magnetic sensor 20 are oblique at 45° with respect to both the direction parallel to the first magnetization direction (W1 direction) and the direction parallel to the third magnetization direction (U direction) of the second magnetic sensor 20.

Similarly, the directions of the magnetic fields generated by the coil and applied to the free layers 54 in the third magnetic sensor 30 intersect each of the first to fourth magnetization directions (W2 direction, −W2 direction, U direction, and −U direction) of the third magnetic sensor 30. In particular, in the example shown in FIGS. 13 and 14, the directions of the magnetic fields applied to the free layers 54 in the third magnetic sensor 30 are oblique at 45° with respect to both the direction parallel to the first magnetization direction (W2 direction) and the direction parallel to the third magnetization direction (U direction) of the third magnetic sensor 30.

Each lower electrode 61B has a long slender shape. Two lower electrodes 61B adjoining in the longitudinal direction of the lower electrodes 61B have a gap therebetween. Second MR elements 50B are disposed near both longitudinal ends on the top surface of each lower electrode 61B.

Each upper electrode 62B has a long slender shape, and electrically connects two adjoining second MR elements 50B that are disposed on two lower electrodes 61B adjoining in the longitudinal direction of the lower electrodes 61B.

Each lower electrode 61C has a long slender shape. Two lower electrodes 61C adjoining in the longitudinal direction of the lower electrodes 61C have a gap therebetween. Third MR elements 50C are disposed near both longitudinal ends on the top surface of each lower electrode 61C. Each upper electrode 62C has a long slender shape, and electrically connects two adjoining third MR elements 50C that are disposed on two lower electrodes 61C adjoining in the longitudinal direction of the lower electrodes 61C.

Next, the first to third detection signals will be described with reference to FIGS. 8 to 10. As the strength of the component of the target magnetic field in the first direction (direction parallel to the U direction), i.e., the first component changes, the resistance of each of the resistor sections R11 to R14 of the first magnetic sensor 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first magnetic sensor 10 generates a signal corresponding to the electric potential of the signal output port E11 as a first detection signal S11, and generates a signal corresponding to the electric potential of the signal output port E12 as a first detection signal S12.

As the strength of the component of the target magnetic field in the second direction (direction parallel to the W1 direction), i.e., the second component changes, the resistance of each of the resistor sections R21 to R24 of the second magnetic sensor 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second magnetic sensor 20 generates a signal corresponding to the electric potential of the signal output port E21 as a second detection signal S21, and generates a signal corresponding to the electric potential of the signal output port E22 as a second detection signal S22.

As the strength of the component of the target magnetic field in the third direction (direction parallel to the W2 direction), i.e., the third component changes, the resistance of each of the resistor sections R31 to R34 of the third magnetic sensor 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third magnetic sensor 30 generates a signal corresponding to the electric potential of the signal output port E31 as a third detection signal S31, and generates a signal corresponding to the electric potential of the signal output port E32 as a third detection signal S32.

Next, the operation of the processor 40 will be described. The processor 40 generates a first detection value Su corresponding to the first component (component in the direction parallel to the U direction) of the target magnetic field based on the first detection signals S11 and S12. In the present example embodiment, the processor 40 generates the first detection value Su by an arithmetic including obtainment of the difference S11-S12 between the first detection signal S11 and the first detection signal S12. The first detection value Su may be the difference S11-S12 itself, or may be a result of a predetermined correction, such as a gain adjustment or an offset adjustment, made to the difference S11-S12.

The processor 40 generates a second detection value and a third detection value based on the second detection signals S21 and S22 and the third detection signals S31 and S32. The second detection value is a detection value corresponding to a component of the target magnetic field in a direction that is parallel to the reference plane 4a and orthogonal to the first direction (direction parallel to the U direction). In the present example embodiment, as the second detection value, the processor 40 generates a detection value corresponding to the component of the target magnetic field in a direction parallel to the V direction. The third detection value is a detection value corresponding to a component of the target magnetic field in a direction perpendicular to the reference plane 4a, i.e., a component in a direction parallel to the Z direction. The second detection value is represented by a symbol Sv, and the third detection value is represented by a symbol Sz.

The processor 40 generates the second and third detection values Sy and Sz as follows, for example. First, the processor 40 generates a value S2 by an arithmetic including obtainment of the difference S21-S22 between the second detection signal S21 and the second detection signal S22, and generates a value S3 by an arithmetic including obtainment of the difference S31-S32 between the third detection signal S31 and the third detection signal S32. Next, the processor 40 calculates values S3 and S4 using the following expressions (1) and (2).

$$S3=(S2+S1)/\cos \alpha \qquad (1)$$

$$S4=(S2-S1)/\sin \alpha \qquad (2)$$

The second detection value Sv may be the value S3 itself, or may be a result of a predetermined correction, such as a gain adjustment or an offset adjustment, made to the value S3. In the same manner, the third detection value Sz may be the value S4 itself, or may be a result of a predetermined correction, such as a gain adjustment or an offset adjustment, made to the value S4.

As described above, the U direction is a direction rotated from the X direction to the −Y direction by a. The first detection value Su therefore also has a correspondence with the component of the target magnetic field in the direction parallel to the X direction. The V direction is a direction rotated from the Y direction to the X direction by α. The second detection value Sv therefore also has a correspondence with the component of the target magnetic field in the direction parallel to the Y direction. The processor 40 may generate a detection value corresponding to the component of the target magnetic field in the direction parallel to the X direction based on the first detection signals S11 and S12 or the first detection value Su. Similarly, the processor 40 may generate a detection value corresponding to the component of the target magnetic field in the direction parallel to the Y direction based on the second detection signals S21 and S22 and the third detection signals S31 and S32 or the second detection value Sv.

Figure 16:
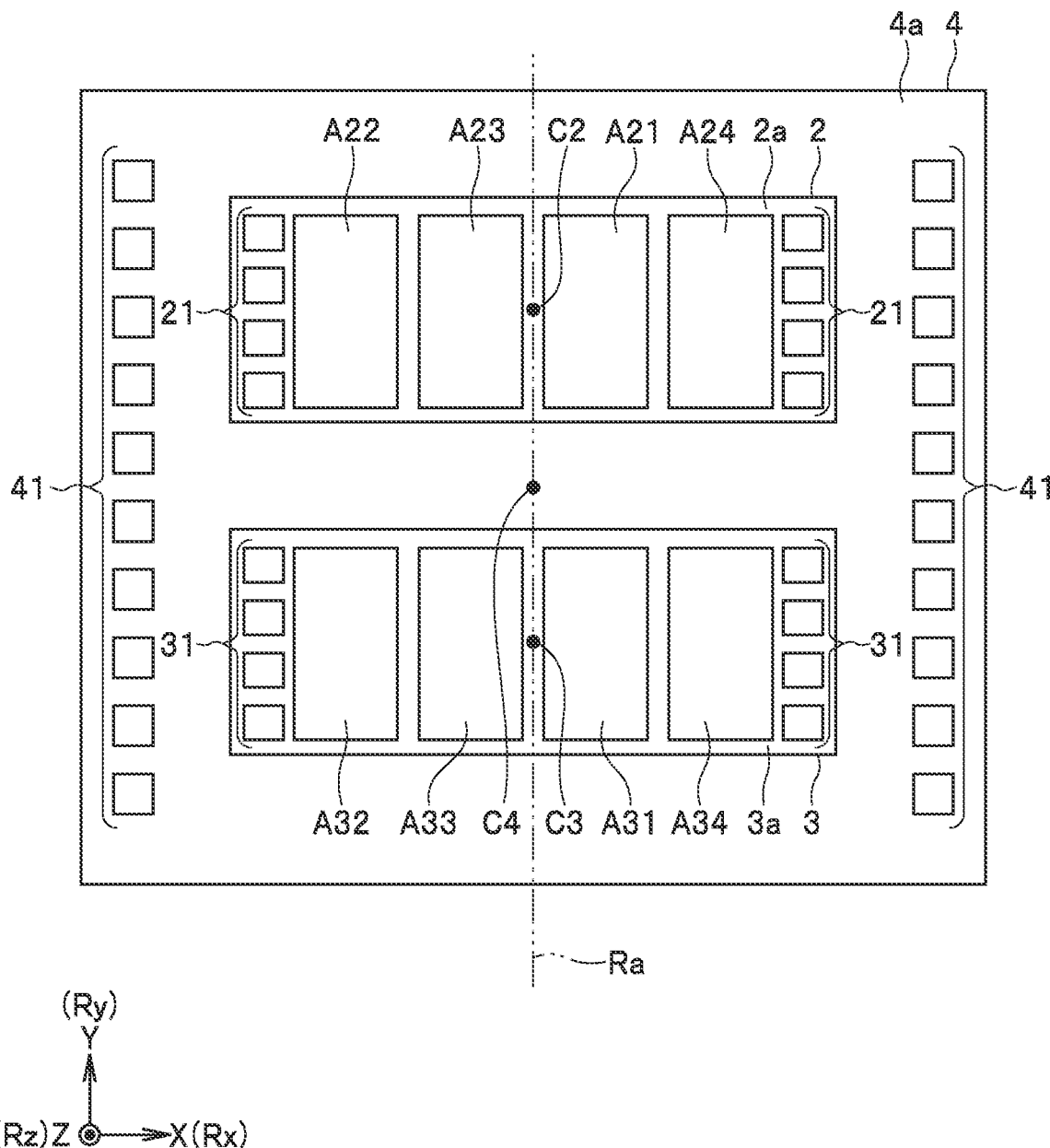
FIG. 16 is an explanatory diagram for describing a layout of element layout areas of the first example embodiment of the technology.

Next, referring to FIG. 16, the structural features of the magnetic sensor device 1 will be described. FIG. 16 is an explanatory diagram for describing the layout of element layout areas.

The features of the first magnetic sensor 10 will initially be described. The first magnetic sensor 10 includes an element layout area for laying out the plurality of first MR elements 50A. The element layout area for laying out the plurality of first MR elements 50A will hereinafter be referred to as the element layout area of the first magnetic sensor 10. In the present example embodiment, the first magnetic sensor 10 is included in the first chip 2. The element layout area of the first magnetic sensor 10 is thus also included in the first chip 2. The element layout area of the first magnetic sensor 10 may be located inside the first chip 2 or at the surface of the first chip 2. In the present example embodiment, a part or all of the top surface 2a of the first chip 2 is the element layout area of the first magnetic sensor 10. The following description will be given by using a case where the entire top surface 2a of the first chip 2 is the element layout area of the first magnetic sensor 10, as an example.

In FIG. 16, a point denoted by the symbol C2 represents the center of gravity of the top surface 2a of the first chip 2, i.e., the element layout area of the first magnetic sensor 10 when seen in the first reference direction Rz. A point denoted by the symbol C4 represents the center of gravity of the reference plane 4a of the support 4 when seen in the first reference direction Rz. As shown in FIG. 16, when seen in the first reference direction Rz, the center of gravity C2 of the element layout area of the first magnetic sensor 10 is deviated from the center of gravity C4 of the reference plane 4a. In the present example embodiment, the deviation of the center of gravity C2 from the center of gravity C4 in the second reference direction Ry is greater than the deviation of the center of gravity C2 from the center of gravity C4 in the third reference direction Rx.

In FIG. 16, a straight line denoted by Ra represents a straight line that passes through the center of gravity C4 and is parallel to the second reference direction Ry. This straight line will hereinafter be referred to as a reference axis Ra. In the present example embodiment, the center of gravity C2 overlaps the reference axis Ra when seen in the first reference direction Rz.

The element layout area of the first magnetic sensor 10 includes a first area A21, a second area A22, a third area A23, and a fourth area A24. The first area A21 is an area for laying out at least one first MR element 50A constituting the first resistor section R11 among the plurality of first MR elements 50A. The second area A22 is an area for laying out at least one first MR element 50A constituting the second resistor section R12 among the plurality of first MR elements 50A. The third area A23 is an area for laying out at least one first MR element 50A constituting the third resistor section R13 among the plurality of first MR elements 50A. The fourth area A24 is an area for laying out at least one first MR element 50A constituting the fourth resistor section R14 among the plurality of first MR elements 50A.

At least two of the first to fourth areas A21, A22, A23, and A24 are arranged along the third reference direction Rx so that at least parts of the respective at least two areas sandwich the reference axis Ra therebetween when seen in the first reference direction Rz. In the present example embodiment, the second area A22 and the fourth area A24 are arranged along the third reference direction Rx to sandwich the reference axis Ra therebetween when seen in the first reference direction Rz. The first area A21 is located between the second area A22 and the fourth area A24 when seen in the first reference direction Rz. The third area A23 is located between the first area A21 and the second area A22 when seen in the first reference direction Rz. In the example shown in FIG. 16, the first area A21 and the third area A23 are also arranged along the third reference direction Rx to sandwich the reference axis Ra therebetween when seen in the first reference direction Rz.

In the present example embodiment, the second area A22 and the fourth area A24 are symmetrically arranged about the reference axis Ra when seen in the first reference direction Rz. The first area A21 and the third area A23 are symmetrically arranged about the reference axis Ra when seen in the first reference direction Rz.

If the entire top surface 2a of the first chip 2 is the element layout area of the first magnetic sensor 10, the element layout area may include an area for laying out the plurality of first pads 21. If a part of the top surface 2a of the first chip 2 is the element layout area of the first magnetic sensor 10, the element layout area may or may not include the area for laying out the plurality of first pads 21.

Next, the features of the second and third magnetic sensors 20 and 30 will be described. The second magnetic sensor 20 includes an element layout area for laying out the plurality of second MR elements 50B. The third magnetic sensor 30 includes an element layout area for laying out the plurality of third MR elements 50C. In the present example embodiment, the second and third magnetic sensors 20 and 30 are included in the second chip 3. The element layout area for laying out the plurality of second MR elements 50B and the element layout area for laying out the plurality of third MR elements 50C are therefore also included in the second chip 3. In the present example embodiment, a common element layout area is used as the element layout area for laying out the plurality of second MR elements 50B and the element layout area for laying out the plurality of third MR elements 50C. The common element layout area will hereinafter be referred to also as an element layout area of the second and third magnetic sensors 20 and 30.

The element layout area of the second and third magnetic sensors 20 and 30 may be located inside the second chip 3 or at the surface of the second chip 3. In the present example embodiment, a part or all of the top surface 3a of the second chip 3 is the element layout area of the second and third magnetic sensors 20 and 30. The following description will be given by using a case where the entire top surface 3a of the second chip 3 is the element layout area of the second and third magnetic sensors 20 and 30 as an example.

In FIG. 16, a point denoted by the symbol C3 represents the center of gravity of the top surface 3a of the second chip 3, i.e., the center of gravity of the element layout area of the second and third magnetic sensors 20 and 30 when seen in the first reference direction Rz. As shown in FIG. 16, when seen in the first reference direction Rz, the center of gravity C3 of the element layout area of the second and third magnetic sensors 20 and 30 is deviated from the center of gravity C4 of the reference plane 4a. In the present example embodiment, the deviation of the center of gravity C3 from the center of gravity C4 in the second reference direction Ry is greater than the deviation of the center of gravity C3 from the center of gravity C4 in the third reference direction Rx. In the present example embodiment, the center of gravity C3 overlaps the reference axis Ra when seen in the first reference direction Rz.

The element layout area for laying out the plurality of second MR elements 50B includes a first area, a second area, a third area, and a fourth area. The first area is an area for laying out at least one second MR element 50B constituting the first resistor section R21 among the plurality of second MR elements 50B. The second area is an area for laying out at least one second MR element 50B constituting the second resistor section R22 among the plurality of second MR elements 50B. The third area is an area for laying out at least one second MR element 50B constituting the third resistor section R23 among the plurality of second MR elements 50B. The fourth area is an area for laying out at least one second MR element 50B constituting the fourth resistor section R24 among the plurality of second MR elements 50B.

The element layout area for laying out the plurality of third MR elements 50C includes a first area, a second area, a third area, and a fourth area. The first area is an area for laying out at least one third MR element 50C constituting the first resistor section R31 among the plurality of third MR elements 50C. The second area is an area for laying out at least one third MR element 50C constituting the second resistor section R32 among the plurality of third MR elements 50C. The third area is an area for laying out at least one third MR element 50C constituting the third resistor section R33 among the plurality of third MR elements 50C. The fourth area is an area for laying out at least one third MR element 50C constituting the fourth resistor section R34 among the plurality of third MR elements 50C.

In the present example embodiment, a common area is used as the first area of the element layout area for laying out the plurality of second MR elements 50B and the first area of the element layout area for laying out the plurality of third MR elements 50C. This common area will hereinafter be referred to as a first area A31.

Similarly, in the present example embodiment, a common area is used as the second area of the element layout area for laying out the plurality of second MR elements 50B and the second area of the element layout area for laying out the plurality of third MR elements 50C. This common area will hereinafter be referred to as a second area A32.

Similarly, in the present example embodiment, a common area is used as the third area of the element layout area for laying out the plurality of second MR elements 50B and the third area of the element layout area for laying out the plurality of third MR elements 50C. This common area will hereinafter be referred to as a third area A33.

Similarly, in the present example embodiment, a common area is used as the fourth area of the element layout area for laying out the plurality of second MR elements 50B and the fourth area of the element layout area for laying out the plurality of third MR elements 50C. This common area will hereinafter be referred to as a fourth area A34.

The positional relationships among the first to fourth areas A31, A32, A33, and A34 are the same as those among the first to fourth areas A21, A22, A23, and A24 of the element layout area of the first magnetic sensor 10. The description of the positional relationships among the first to fourth areas A21, A22, A23, and A24 applies to those among the first to fourth areas A31, A32, A33, and A34 if the first to fourth areas A21, A22, A23, and A24 in the description are replaced with the first to fourth areas A31, A32, A33, and A34, respectively.

If the entire top surface 3a of the second chip 3 is the element layout area of the second and third magnetic sensors 20 and 30, the element layout area may include an area for laying out the plurality of second pads 31. If a part of the top surface 3a of the second chip 3 is the element layout area of the second and third magnetic sensors 20 and 30, the element layout area may or may not include the area for laying out the plurality of second pads 31.

Figure 17:
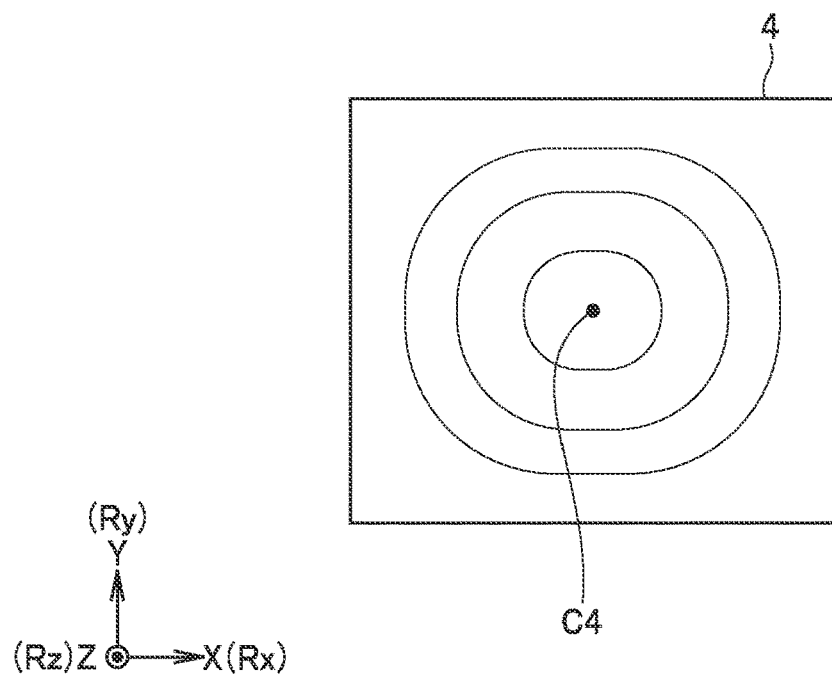
FIG. 17 is an explanatory diagram schematically showing a stress distribution within a support of the first example embodiment of the technology.

The operation and effect of the magnetic sensor device 1 according to the present example embodiment will now be described. If stress occurs in the support 4 due to an external force or temperature, the stress distribution within the support 4 is symmetrical about the center of gravity C4 of the reference plane 4a. FIG. 17 is an explanatory diagram schematically showing the stress distribution within the support 4. In FIG. 17, the stress distribution is shown using contour lines.

If stress is applied to an MR element 50, the magnetization direction of the magnetization pinned layer 52 in the MR element 50 can deviate from its designed direction. For example, if tensile stress is applied to the MR element 50 in a direction intersecting the magnetization direction of the magnetization pinned layer 52, the magnetization direction of the magnetization pinned layer 52 changes slightly to the direction of the tensile stress. As a result, the resistance of the MR element 50 when the target magnetic field is not applied to the MR element 50 changes.

Now, the effect of stress applied to each MR element 50 on the detection value will be discussed by using the first magnetic sensor 10 as an example. Suppose that the magnitude of stress applied to each first MR element 50A varies between the first resistor section R11 and the second resistor section R12. In such a case, the amount of change in the resistance of the first resistor section R11 due to the stress and the amount of change in the resistance of the second resistor section R12 due to the stress are different from each other. This causes an offset in the first detection signal S11.

Similarly, if the magnitude of stress applied to each first MR element 50A varies between the third resistor section R13 and the fourth resistor section R14, the amount of change in the resistance of the third resistor section R13 due to the stress and the amount of change in the resistance of the fourth resistor section R14 due to the stress are different from each other. This causes an offset in the first detection signal S12. The offsets in the first detection signals S11 and S12 cause an offset in the first detection value Su.

To make the magnitude of the stress applied to each first MR element 50A in the first resistor section R11 and that in the second resistor section R12 the same and make the magnitude of the stress applied to each first MR element 50A in the third resistor section R13 and that in the fourth resistor section R14 the same, the first chip 2 can be mounted on the support 4 so that the center of gravity of the planar shape of the first chip 2 matches the center of gravity C4 of the reference plane 4a. However, in such a case, the second chip 3 may be unable to be mounted on the support 4 depending on the size of the first chip 2 and the second chip 3.

By contrast, in the present example embodiment, the magnetization directions of the magnetization pinned layers 52 in each of the first to fourth resistor sections R11, R12, R13, and R14, the magnetization directions of the free layers 54 in each of the first to fourth resistor sections R11, R12, R13, and R14, and the layout of the first to fourth areas A21, A22, A23, and A24 of the element layout area of the first magnetic sensor 10 are defined as described above while locating the first chip 2 off the center of gravity C4 of the reference plane 4a. According to the present example embodiment, an offset in the first detection value Su can thereby be prevented.

The reason why an offset in the first detection value Su can be prevented will be described in detail below. In the following description, the term "resistance" refers to the resistance when the target magnetic field is not applied to the first magnetic sensor 10. A case where stress in the second reference direction Ry is applied to the first magnetic sensor 10 will initially be described. Here, the resistance of the first resistor section R11 is denoted by r1, the resistance of the second resistor section R12 by r2, the resistance of the third resistor section R13 by r3, and the resistance of the fourth resistor section R14 by r4. Note that r1, r2, r3, and r4 are the same if no stress is applied to the first magnetic sensor 10.

The first detection value Su depends on a difference S11−S12 between the first detection signal S11 and the first detection signal S12. The difference S11−S12 depends on a potential difference E between the signal output ports E11 and E12. The potential difference E is expressed by the following expression (3):

$$E = V \cdot (r2 \cdot r4 - r1 \cdot r3) / \{(r1+r2)(r3+r4)\} \quad (3)$$

In expression (3), V is the voltage applied to the power supply port V1.

If stress in the second reference direction Ry is applied to the first magnetic sensor 10, r1 and r4 increase and r2 and r3 decrease, or r1 and r4 decrease and r2 and r3 increase. The stress distributions within the respective first to fourth areas A21, A22, A23, and A24 are substantially the same. If the mode of change in r1, r2, r3, and r4 described above is applied to the expression (3), the potential difference E ideally hardly changes. In other words, hardly any offset occurs in the first detection value Su even if stress in the second reference direction Ry is applied to the first magnetic sensor 10.

Next, a case where stress in the third reference direction Rx is applied to the first magnetic sensor 10 will be described. The mode of increase and decrease in r1, r2, r3, and r4 when stress in the third reference direction Rx is applied to the first magnetic sensor 10 is the same as when stress in the second reference direction Ry is applied to the first magnetic sensor 10. The stress applied to the first and third areas A21 and A23 is higher than the stress applied to the second and fourth areas A22 and A24. The amounts of change in r1 and r3 due to the stress are thus greater than the amounts of change in r2 and r4 due to the stress. If the mode of change in r1, r2, r3, and r4 described above is applied to expression (3), the potential difference E ideally hardly changes. In other words, hardly any offset occurs in the first detection value Su even if stress in the third reference direction Rx is applied to the first magnetic sensor 10.

According to the present example embodiment, an offset in the first detection value Su can thus be prevented.

To obtain the foregoing effect, the magnetization directions of the free layers 54 in each of the first to fourth resistor sections R11, R12, R13, and R14 need to be defined as described above. However, in some cases, the magnetization directions of the free layers 54 can be reversed from their designed directions because of an external magnetic field. In the present example embodiment, the first magnetic sensor 10 includes the coil that is configured so that a magnetic field in the X direction is applied to either of the free layers 54 in each of the first and second resistance sections R11 and R12 or the free layers 54 in each of the third and fourth resistor sections R13 and R14, and so that a magnetic field in the −X direction is applied to the other of the free layers 54. According to the present example embodiment, the magnetization directions of the free layers 54 can thereby be aligned to the designed directions.

Up to this point, the effect of stress applied to each individual MR element 50 has been described by using the first magnetic sensor 10 as an example. The foregoing description also applies to the second and third magnetic sensors 20 and 30. According to the present example embodiment, an offset in the second detection value Sv and the third detection value Sz can be prevented.

Next, a manufacturing method for the magnetic sensor device 1 according to the present example embodiment will be briefly described. The manufacturing method for the magnetic sensor device 1 includes a step of forming the first chip 2, a step of forming the second chip 3, and a step of mounting the first and second chips 2 and 3 on the support 4.

The step of forming the first chip 2 includes a step of forming the first magnetic sensor 10. The step of forming the second chip 3 includes a step of forming the second and third magnetic sensors 20 and 30. The step of forming the first magnetic sensor 10 and the step of forming the second and third magnetic sensors 20 and 30 each include a step of forming a plurality of MR elements 50.

In the step of forming a plurality of MR elements 50, a plurality of initial MR elements to later become the plurality of MR elements 50 are initially formed. Each of the plurality of initial MR elements includes an initial magnetization pinned layer to later become the magnetization pinned layer 52, a free layer 54, a gap layer 53, and an antiferromagnetic layer 51.

Next, the magnetization directions of the initial magnetization pinned layers are fixed to predetermined directions using laser light and external magnetic fields in the foregoing predetermined directions. For example, a plurality of initial MR elements to later become a plurality of MR elements 50 constituting the first and third resistor sections R11 and R13 of the first magnetic sensor 10 are irradiated with laser light while an external magnetic field in the first magnetization direction (U direction) is applied thereto. When the irradiation with the laser light is completed, the magnetization directions of the initial magnetization pinned layers are fixed to the first magnetization direction. This makes the initial magnetization pinned layers into magnetization pinned layers 52, and the initial MR elements into MR elements 50. In a plurality of initial MR elements to later become a plurality of MR elements 50 constituting the second and fourth resistor sections R12 and R14 of the first magnetic sensor 10, the magnetization directions of the initial magnetization pinned layers in each of the plurality of initial MR elements can be fixed to the second magnetization direction (−U direction) by setting the direction of the external magnetic field to the second magnetization direction. The plurality of MR elements 50 are formed in such a manner.

Modification Example

Figure 18:
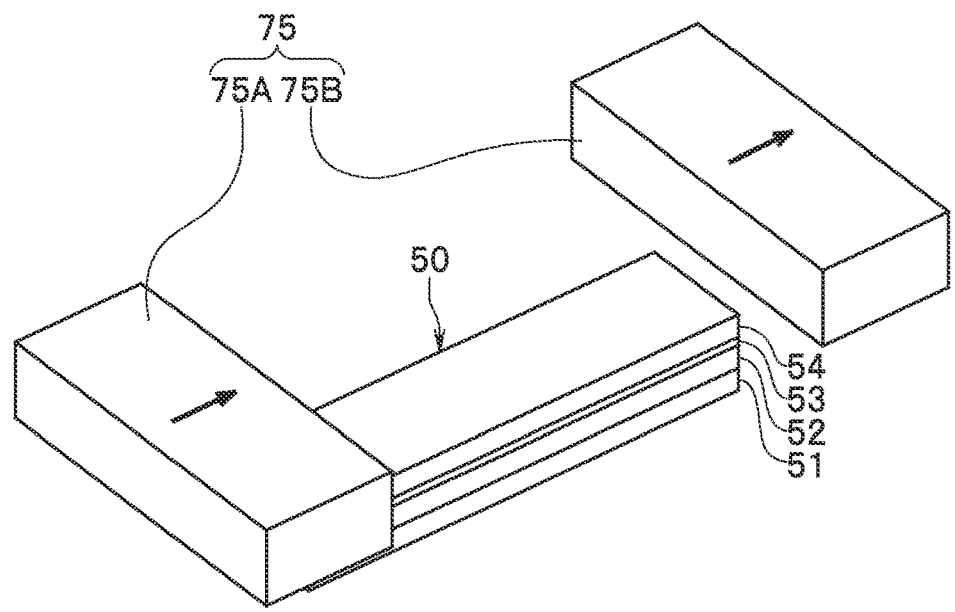
FIG. 18 is a perspective view showing a magnetoresistive element in a modification example of the first example embodiment of the technology.

Next, a modification example of the present example embodiment will be described with reference to FIG. 18. FIG. 18 is a perspective view showing an MR element 50 according to the modification example. In the modification example, each of the first to third magnetic sensors 10, 20, and 30 includes a magnetic field generator 75 including a plurality of magnetic pairs of instead of the magnetic field generator including the coil. The magnetic field generator 75 is configured to apply a magnetic field, in the third magnetization direction or in the fourth magnetization direction, to the free layer 54.

Each of the plurality of magnetic pairs includes two magnets 75A and 75B. The magnet 75A is located near one longitudinal end of the MR element 50. The magnet 75B is located near the other longitudinal end of the MR element

50. The magnetization of the magnets 75A and 75B includes a component in the third magnetization direction or a component in the fourth magnetization direction. Whether the magnetization of the magnets 75A and 75B includes the component in the third magnetization direction or the component in the fourth magnetization direction is selected based on the magnetization direction of the free layer 54 to which the magnets 75A and 75B apply the magnetic field when the target magnetic field is not applied.

If the magnetization of the magnets 75A and 75B includes a component in a specific magnetization direction, the component in the specific magnetization direction may be a main component of the magnetization of the magnets 75A and 75B. Alternatively, the magnetization of the magnets 75A and 75B may be free of a component in a direction orthogonal to the specific magnetization direction. In the modification example, if the magnetization of the magnets 75A and 75B includes a component in a specific magnetization direction, the magnetization directions of the magnets 75A and 75B are the same or substantially the same as the specific magnetization direction.

According to the modification example, the magnetic field generator 75 can prevent the magnetization direction of the free layer 54 from being opposite to the designed direction because of an external magnetic field.

Second Example Embodiment

Figure 19:
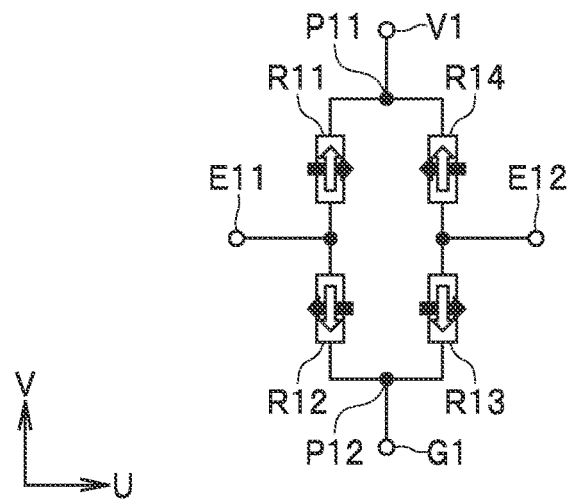
FIG. 19 is a circuit diagram showing a circuit configuration of a first magnetic sensor of a second example embodiment of the technology.
Figure 20:
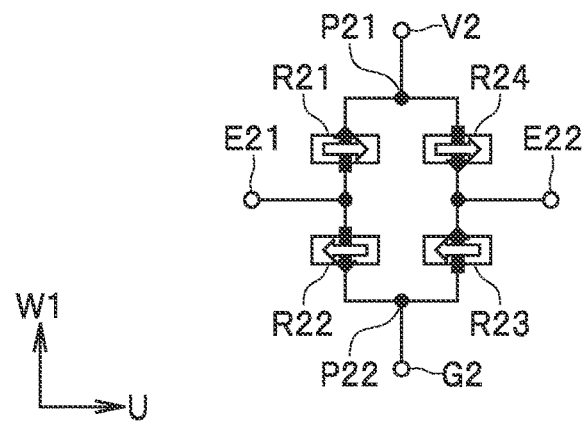
FIG. 20 is a circuit diagram showing a circuit configuration of a second magnetic sensor of the second example embodiment of the technology.
Figure 21:
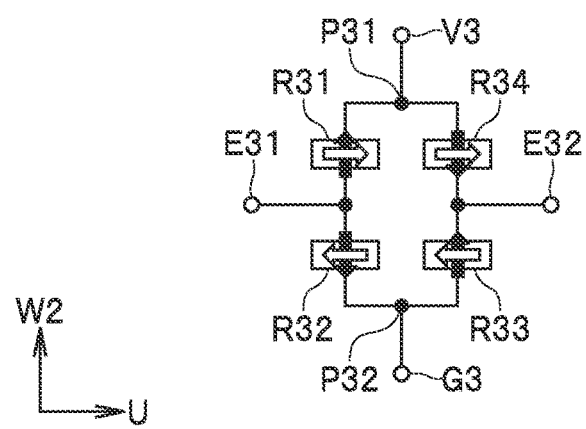
FIG. 21 is a circuit diagram showing a circuit configuration of a third magnetic sensor of the second example embodiment of the technology.

A second example embodiment of the technology will now be described. In the second example embodiment, the magnetization directions of the free layers 54 of the MR elements 50 are different from those in the first example embodiment. The magnetization directions of the free layers 54 will be described below with reference to FIGS. 19 to 21. FIG. 19 is a circuit diagram showing a circuit configuration of the first magnetic sensor 10. FIG. 20 is a circuit diagram showing a circuit configuration of the second magnetic sensor 20. FIG. 21 is a circuit diagram showing a circuit configuration of the third magnetic sensor 30.

In FIG. 19, the hollow arrows represent the magnetization directions of the free layers 54 in the respective first to fourth resistor sections R11, R12, R13, and R14 of the first magnetic sensor 10 when the target magnetic field is not applied to the first magnetic sensor 10. As shown in FIG. 19, the magnetization of the free layers 54 in each of the first and fourth resistor sections R11 and R14 of the first magnetic sensor 10 includes a component in the third magnetization direction (V direction) in the foregoing case. The magnetization of the free layers 54 in each of the second and third resistor sections R12 and R13 of the first magnetic sensor 10 includes a component in the fourth magnetization direction (−V direction) in the foregoing case.

In FIG. 20, the hollow arrows represent the magnetization directions of the free layers 54 in the respective first to fourth resistor sections R21, R22, R23, and R24 of the second magnetic sensor 20 when the target magnetic field is not applied to the second magnetic sensor 20. The description of the magnetization directions of the free layers 54 in the first magnetic sensor 10 applies to the magnetization directions of the free layers 54 in the second magnetic sensor 20 if the first magnetic sensor 10, the resistor sections R11, R12, R13, and R14, the V direction, and the −V direction in the description are replaced with the second magnetic sensor 20, the resistor sections R21, R22, R23, and R24, the U direction, and the −U direction, respectively.

In FIG. 21, the hollow arrows represent the magnetization directions of the free layers 54 in the respective first to fourth resistor sections R31, R32, R33, and R34 of the third magnetic sensor 30 when the target magnetic field is not applied to the third magnetic sensor 30. The description of the magnetization directions of the free layers 54 in the first magnetic sensor 10 applies to the magnetization directions of the free layers 54 in the third magnetic sensor 30 if the first magnetic sensor 10, the resistor sections R11, R12 R13, and R14, the V direction, and the −V direction in the description are replaced with the third magnetic sensor 30, the resistor sections R31, R32, R33, and R34, the U direction, and the −U direction, respectively.

In the present example embodiment, the coil constituted by the plurality of lower coil elements 63A and the plurality of upper coil element 64A according to the first example embodiment, shown in FIGS. 11 and 12, is configured differently from that in the first example embodiment. In the present example embodiment, the coil is configured so that a magnetic field in the X direction can be applied to either of the free layers 54 in each of the first and fourth resistor sections R11 and R14 or the free layers 54 in each of the second and third resistor sections R12 and R13, and a magnetic field in the −X direction can be applied to the other of the free layers 54.

In the present example embodiment, the coil constituted by the plurality of lower coil elements 63B and the plurality of upper coil elements 64B according to the first example embodiment, shown in FIGS. 13 and 14, is configured differently from that in the first example embodiment. In the present example embodiment, the coil is configured so that a magnetic field in the X direction can be applied to either of the free layers 54 in each of the first and fourth resistor sections R21 and R24 of the second magnetic sensor 20 and the first and fourth resistor sections R31 and R34 of the third magnetic sensor 30 or the free layers 54 in each of the second and third resistor sections R22 and R23 of the second magnetic sensor 20 and the second and third resistor sections R32 and R33 of the third magnetic sensor 30, and a magnetic field in the −X direction can be applied to the other of the free layers 54.

The operation and effect of the magnetic sensor device 1 according to the present example embodiment will now be described. In the present example embodiment, the magnetization directions of the free layers 54 in each of the first to fourth resistor sections R11, R12, R13, and R14 is defined as described above. Moreover, in the present example embodiment, the magnetization directions of the magnetization pinned layers 52 in each of the first to fourth resistor sections R11, R12, R13, and R14 and the layout of the first to fourth areas A21, A22, A23, and A24 of the element layout area of the first magnetic sensor 10 are defined as described in the first example embodiment (see FIG. 16). According to the present example embodiment, an offset in the first detection value Su can thus be prevented.

The reason why an offset in the first detection value Su can be prevented will be described in detail below. A case where stress in the second reference direction Ry is applied to the first magnetic sensor 10 will initially be described. As in the first example embodiment, the resistance of the first resistor section R11 will be denoted by r1, the resistance of the second resistor section R12 by r2, the resistance of the third resistor section R13 by r3, and the resistance of the fourth resistor section R14 by r4. If stress in the second reference direction Ry is applied to the first magnetic sensor 10, r1 and r2 increase and r3 and r4 decrease, or r1 and r2 decrease and r3 and r4 increase. As in the first example embodiment, the respective amounts of change in r1, r2, r3, and r4 due to stress are substantially the same. If the mode of change in r1, r2, r3, and r4 described above is applied to the expression (3) in the first example embodiment, the potential difference E ideally hardly changes. In other words, hardly any offset occurs in the first detection value Su even if stress in the second reference direction Ry is applied to the first magnetic sensor 10.

Next, a case where stress in the third reference direction Rx is applied to the first magnetic sensor 10 will be described. The mode of increase and decrease in r1, r2, r3, and r4 when stress in the third reference direction Rx is applied to the first magnetic sensor 10 is the same as when stress in the second reference direction Ry is applied to the first magnetic sensor 10. As in the first example embodiment, the amounts of change in r1 and r3 due to the stress are greater than the amounts of change in r2 and r4 due to the stress. If the mode of change in r1, r2, r3, and r4 described above is applied to the expression (3) in the first example embodiment, the potential difference E ideally hardly changes. In other words, hardly any offset occurs in the first detection value Su even if stress in the third reference direction Rx is applied to the first magnetic sensor 10.

According to the present example embodiment, an offset in the first detection value Su can thus be prevented.

Up to this point, the description has been given by using the first magnetic sensor 10 as an example. The foregoing description also applies to the second and third magnetic sensors 20 and 30. According to the present example embodiment, an offset in the second detection value Sv and an offset in the third detection value Sz can be prevented.

The configuration, operation and effects of the present example embodiment are otherwise the same as those of the first example embodiment.

Third Example Embodiment

Figure 22:
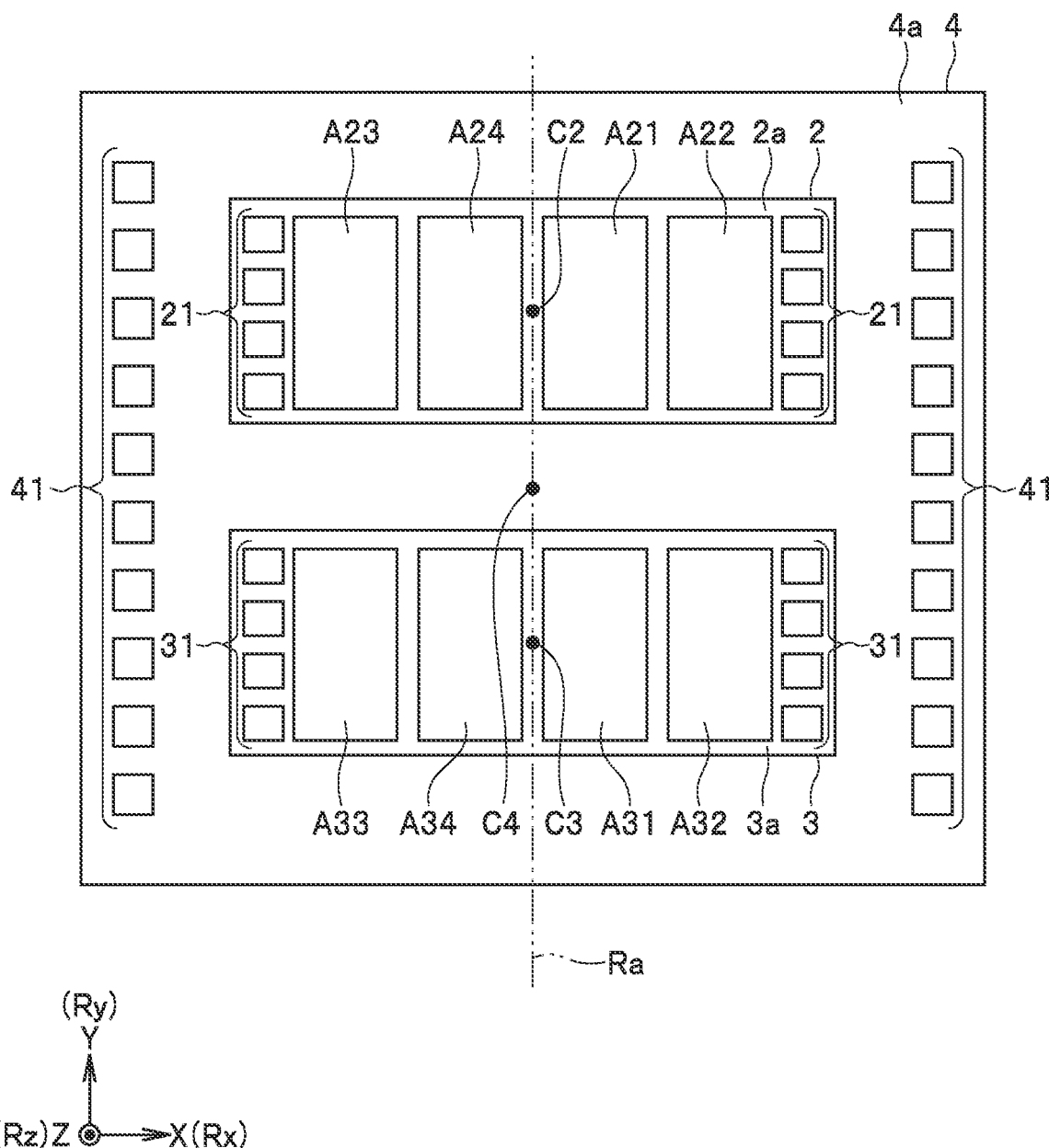
FIG. 22 is an explanatory diagram for describing a layout of element layout areas of a third example embodiment of the technology.

A third example embodiment of the technology will now be described. In the third example embodiment, the layout of the element layout area of the first magnetic sensor 10 and that of the element layout area of the second and third magnetic sensors 20 and 30 are different from those in the first example embodiment. The layout of the element layout areas will be described below with reference to FIG. 22. FIG. 22 is an explanatory diagram for describing the layout of the element layout areas.

Initially, the layout of the first to fourth areas A21, A22, A23, and A24 in the element layout area of the first magnetic sensor 10 will be described. In the present example embodiment, the second area A22 and the third area A23 are arranged along the third reference direction Rx to sandwich the reference axis Ra therebetween when seen in the first reference direction Rz. The first area A21 is located between the second area A22 and the third area A23 when seen in the first reference direction Rz. The fourth area A24 is located between the first area A21 and the third area A23 when seen in the first reference direction Rz. In the example shown in FIG. 22, the first area A21 and the fourth area A24 are also arranged along the third reference direction Rx to sandwich the reference axis Ra therebetween when seen in the first reference direction Rz.

In the present example embodiment, the second area A22 and the third area A23 are symmetrically arranged about the reference axis Ra when seen in the first reference direction Rz. The first area A21 and the fourth area A24 are also symmetrically arranged about the reference axis Ra when seen in the first reference direction Rz.

Next, the layout of the first to fourth areas A31, A32, A33, and A34 in the element layout area of the second and third magnetic sensors 20 and 30 will be described. The positional relationships among the first to fourth areas A31, A32, A33, and A34 are the same as those among the first to fourth areas A21, A22, A23, and A24 in the element layout area of the first magnetic sensor 10. The description of the positional relationships among the first to fourth areas A21, A22, A23, and A24 applies to the positional relationships among the first to fourth areas A31, A32, A33, and A34 if the first to fourth areas A21, A22, A23, and A24 in the description are replaced with the first to fourth areas A31, A32, A33, and A34, respectively.

The operation and effect of the magnetic sensor device 1 according to the present example embodiment will now be described. In the present example embodiment, the layout of the first to fourth areas A21, A22, A23, and A24 in the element layout area of the first magnetic sensor 10 is defined as described above. Moreover, in the present example embodiment, the magnetization directions of the magnetization pinned layers 52 in each of the first to fourth resistor sections R11, R12, R13, and R14 of the first magnetic sensor 10 and the magnetization directions of the free layers 54 in each of the first to fourth resistor sections R11, R12, R13, and R14 are defined as described in the first example embodiment (see FIG. 8). According to the present example embodiment, an offset in the first detection value Su can thus be prevented.

The reason why an offset in the first detection value Su can be prevented will be described in detail below. A case where stress in the second reference direction Ry is applied to the first magnetic sensor 10 will initially be described. As in the first example embodiment, the resistance of the first resistor section R11 will be denoted by r1, the resistance of the second resistor section R12 by r2, the resistance of the third resistor section R13 by r3, and the resistance of the fourth resistor section R14 by r4. Like the first example embodiment, if stress in the second reference direction Ry is applied to the first magnetic sensor 10, r1 and r4 increase and r2 and r3 decrease, or r1 and r4 decrease and r2 and r3 increase. The stress distributions within the respective first to fourth areas A21, A22, A23, and A24 are substantially the same. The respective amounts of change in r1, r2, r3, and r4 due to the stress are therefore substantially the same. The mode of change in r1, r2, r3, and r4 described above is the same as that in r1, r2, r3, and r4 when stress in the second reference direction Ry is applied to the first magnetic sensor 10 of the first example embodiment. From the same reason as described in the first example embodiment, hardly any offset therefore occurs in the first detection value Su even if stress in the second reference direction Ry is applied to the first magnetic sensor 10.

Next, a case where stress in the third reference direction Rx is applied to the first magnetic sensor 10 will be described. The mode of increase and decrease in r1, r2, r3, and r4 when stress in the third reference direction Rx is applied to the first magnetic sensor 10 is the same as when stress in the second reference direction Ry is applied to the first magnetic sensor 10. The stress applied to the first and fourth areas A21 and A24 is higher than that applied to the second and third areas A22 and A23. The amounts of change in r1 and r4 due to the stress are therefore greater than the amounts of change in r2 and r3 due to the stress. If the mode of change in r1, r2, r3, and r4 described above is applied to the expression (3) in the first example embodiment, the potential difference E ideally hardly changes. In other words, hardly any offset occurs in the first detection value Su even if stress in the third reference direction Rx is applied to the first magnetic sensor 10.

According to the present example embodiment, an offset in the first detection value Su can thus be prevented.

Up to this point, the description has been given by using the first magnetic sensor 10 as an example. The foregoing description also applies to the second and third magnetic sensors 20 and 30. According to the present example embodiment, an offset in the second detection value Sv and an offset in the third detection value Sz can be prevented.

The configuration, operation and effects of the present example embodiment are otherwise the same as those of the first example embodiment.

Fourth Example Embodiment

Figure 23:
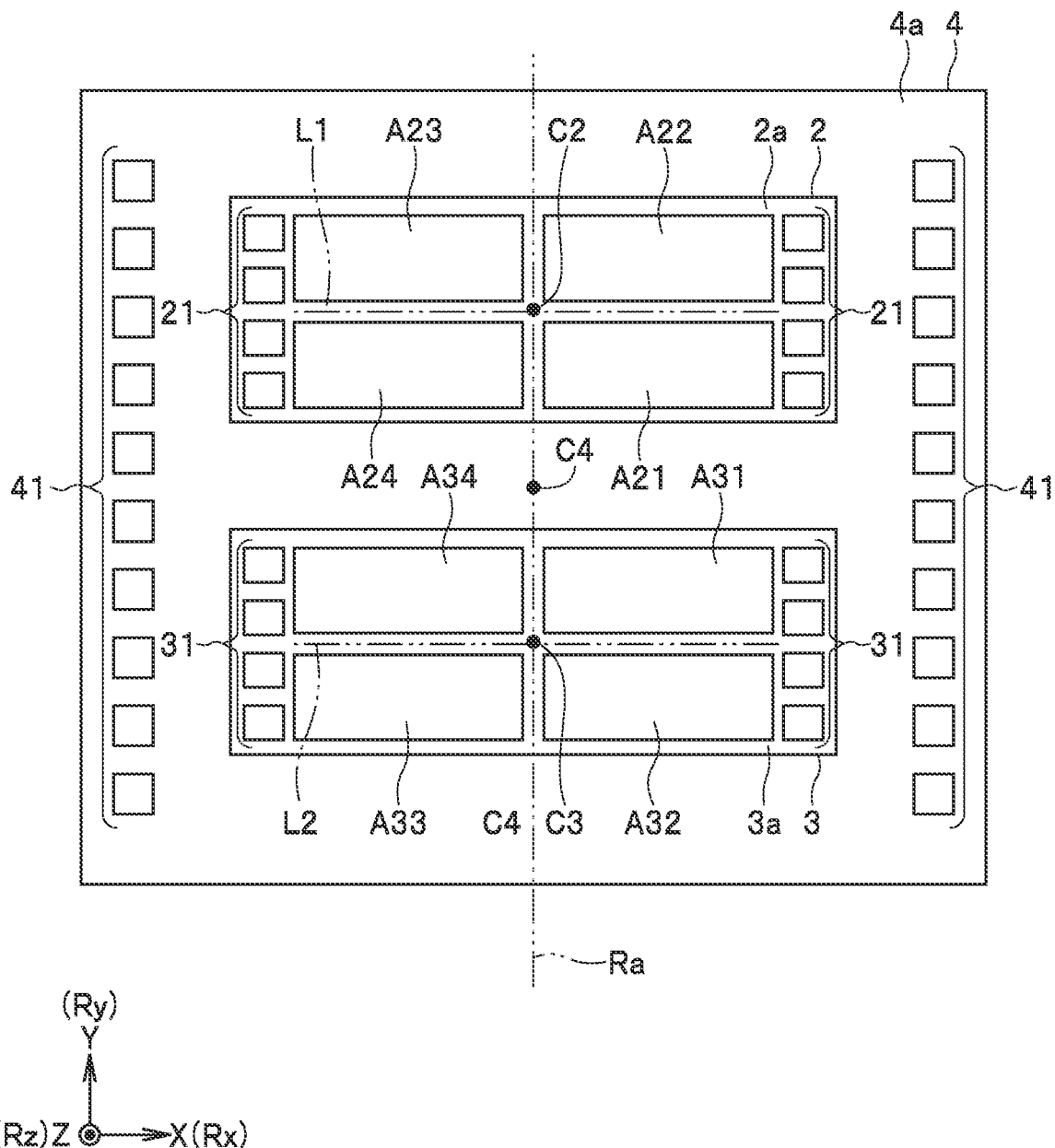
FIG. 23 is an explanatory diagram for describing a layout of element layout areas of a fourth example embodiment of the technology.

A fourth example embodiment of the technology will now be described. In the fourth example embodiment, the layout of the element layout area of the first magnetic sensor 10 and that of the element layout area of the second and third magnetic sensors 20 and 30 are different from those in the first example embodiment. The layout of the element layout areas will be described below with reference to FIG. 23. FIG. 23 is an explanatory diagram for describing the layout of the element layout areas.

Initially, the layout of the first to fourth areas A21, A22, A23, and A24 in the element layout area of the first magnetic sensor 10 will be described. In the present example embodiment, the first area A21 and the fourth area A24 are arranged along the third reference direction Rx so that at least parts of the respective first and fourth areas A21 and A24 sandwich the reference axis Ra therebetween when seen in the first reference direction Rz. The second area A22 and the third area A23 are arranged along the third reference direction Rx so that at least parts of the respective second and third areas A22 and A23 sandwich the reference axis Ra therebetween when seen in the first reference direction Rz. The second area A22 and the third area A23 are located forward of the first area A21 and the fourth area A24, respectively, in the Y direction.

In particular, in the present example embodiment, the first area A21 and the fourth area A24 are symmetrically arranged about the reference axis Ra when seen in the first reference direction Rz. The second area A22 and the third area A23 are symmetrically arranged about the reference axis Ra when seen in the first reference direction Rz. The first area A21 and the second area A22 are symmetrically arranged about a virtual straight line L1 orthogonal to the reference axis Ra when seen in the first reference direction Rz. The third area A23 and the fourth area A24 are symmetrically arranged about the virtual straight line L1 when seen in the first reference direction Rz.

Next, the layout of the first to fourth areas A31, A32, A33, and A34 in the element layout area of the second and third magnetic sensors 20 and 30 will be described. The positional relationships among the first to fourth areas A31, A32, A33, and A34 are the same as those among the first to fourth areas A21, A22, A23, and A24 in the element layout area of the first magnetic sensor 10 except for the layout of the second and third areas A32 and A33 with respect to the first and fourth areas A31 and A34. The description of the positional relationships among the first to fourth areas A21, A22, A23, and A24 applies to the positional relationships among the first to fourth areas A31, A32, A33, and A34 except for the layout of the second and third areas A32 and A33 with respect to the first and fourth areas A31 and A34, if the first to fourth areas A21, A22, A23, and A24 in the description are replaced with the first to fourth areas A31, A32, A33, and A34, respectively.

The second area A32 and the third area A33 are located forward of the first area A31 and the fourth area A34, respectively, in the −Y direction. The first area A31 and the second area A32 are symmetrically arranged about a virtual straight line L2 orthogonal to the reference axis Ra when seen in the first reference direction Rz. The third area A33 and the fourth area A34 are symmetrically arranged about the virtual straight line L2 when seen in the first reference direction Rz.

The operation and effect of the magnetic sensor device 1 according to the present example embodiment will now be described. In the present example embodiment, the layout of the first to fourth areas A21, A22, A23, and A24 in the element layout area of the first magnetic sensor 10 is defined as described above. Moreover, in the present example embodiment, the magnetization directions of the magnetization pinned layers 52 in each of the first to fourth resistor sections R11, R12, R13, and R14 of the first magnetic sensor 10 and the magnetization directions of the free layers 54 in each of the first to fourth resistor sections R11, R12, R13, and R14 are defined as described in the first example embodiment (see FIG. 8). According to the present example embodiment, an offset in the first detection value Su can thus be prevented.

The reason why an offset in the first detection value Su can be prevented will be described in detail below. A case where stress in the second reference direction Ry is applied to the first magnetic sensor 10 will initially be described. As in the first example embodiment, the resistance of the first resistor section R11 will be denoted by r1, the resistance of the second resistor section R12 by r2, the resistance of the third resistor section R13 by r3, and the resistance of the fourth resistor section R14 by r4. If stress in the second reference direction Ry is applied to the first magnetic sensor 10, r1 and r4 increase and r2 and r3 decrease, or r1 and r4 decrease and r2 and r3 increase. The stress applied to the first and fourth areas A21 and A24 is higher than that applied to the second and third areas A22 and A23. The amounts of change in r1 and r4 due to the stress are therefore greater than the amounts of change in r2 and r3 due to the stress. The mode of change in r1, r2, r3, and r4 described above is the same as that in r1, r2, r3, and r4 when stress in the third reference direction Rx is applied to the first magnetic sensor 10 of the first example embodiment. From the same reason as described in the first example embodiment, hardly any offset therefore occurs in the first detection value Su even if stress in the second reference direction Ry is applied to the first magnetic sensor 10.

Next, a case where stress in the third reference direction Rx is applied to the first magnetic sensor 10 will be described. The mode of increase and decrease in r1, r2, r3, and r4 when stress in the third reference direction Rx is applied to the first magnetic sensor 10 is the same as when stress in the second reference direction Ry is applied to the first magnetic sensor 10. The stress distributions within the respective first to fourth areas A21, A22, A23, and A24 are substantially the same. The respective amounts of change in r1, r2, r3, and r4 due to the stress are therefore substantially the same. The mode of change in r1, r2, r3, and r4 described above is the same as that in r1, r2, r3, and r4 when stress in the second reference direction Ry is applied to the first magnetic sensor 10 of the first example embodiment. From the same reason as described in the first example embodiment, hardly any offset therefore occurs in the first detection value Su even if stress in the third reference direction Rx is applied to the first magnetic sensor 10.

According to the present example embodiment, an offset in the first detection value Su can thus be prevented.

Up to this point, the description has been given by using the first magnetic sensor 10 as an example. The foregoing description also applies to the second and third magnetic sensors 20 and 30. According to the present example embodiment, an offset in the second detection value Sv and an offset in the third detection value Sz can be prevented.

The configuration, operation and effects of the present example embodiment are otherwise the same as those of the first example embodiment.

Fifth Example Embodiment

Figure 24:
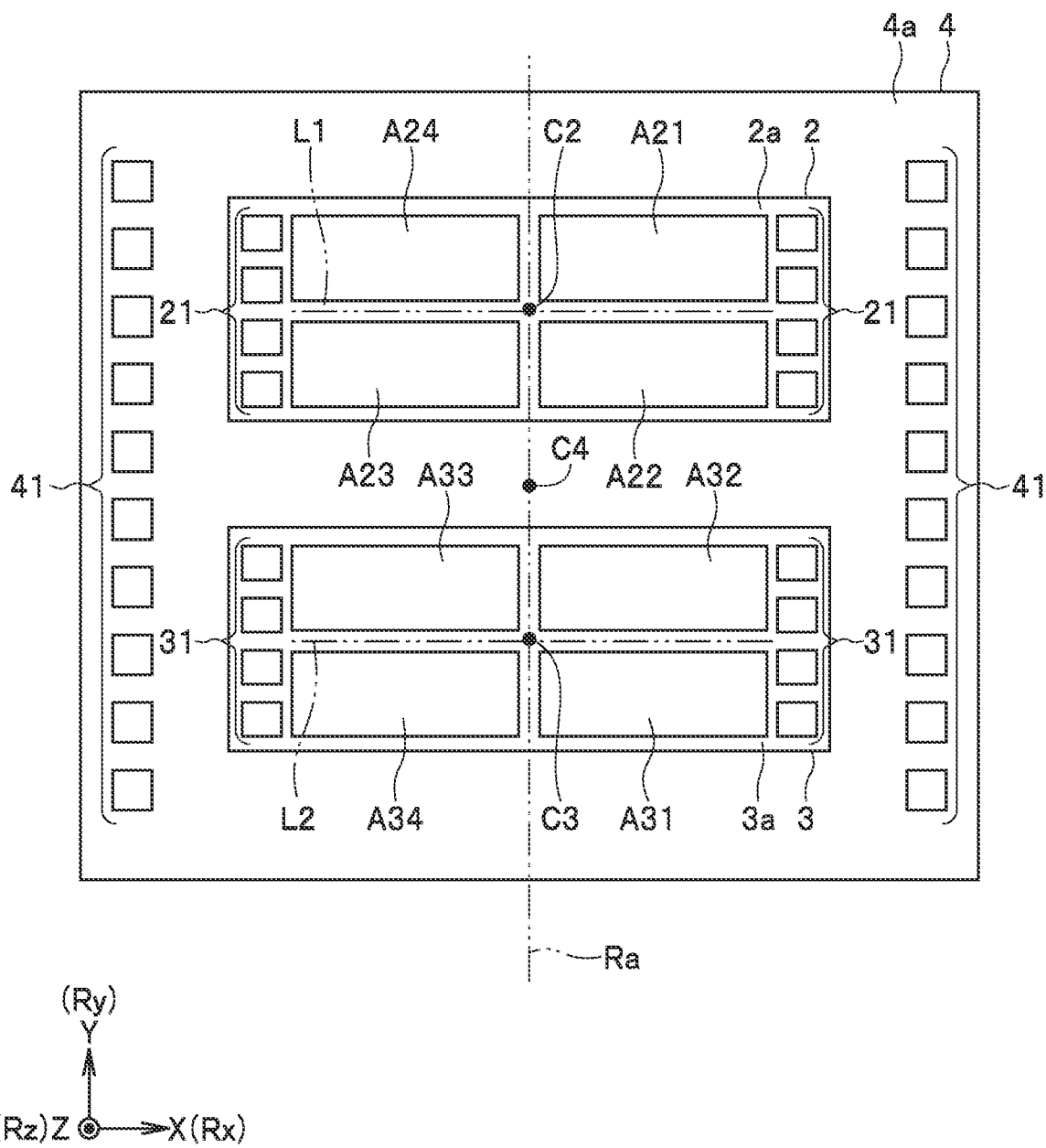
FIG. 24 is an explanatory diagram for describing a layout of element layout areas of a fifth example embodiment of the technology.

A fifth example embodiment of the technology will now be described. In the fifth example embodiment, the layout of the element layout area of the first magnetic sensor 10 and that of the element layout area of the second and third magnetic sensors 20 and 30 are different from those in the fourth example embodiment. The layout of the element layout areas will be described below with reference to FIG. 24. FIG. 24 is an explanatory diagram for describing the layout of the element layout areas.

Initially, the layout of the first to fourth areas A21, A22, A23, and A24 in the element layout area of the first magnetic sensor 10 will be described. The layout of the first to fourth areas A21, A22, A23, and A24 is the same as that in the fourth example embodiment except for the layout of the second and third areas A22 and A23 with respect to the first and fourth areas A21 and A24. In the present example embodiment, the second area A22 and the third area A23 are located forward of the first area A21 and the fourth area A24, respectively, in the −Y direction.

Next, the layout of the first to fourth areas A31, A32, A33, and A34 in the element layout area of the second and third magnetic sensors 20 and 30 will be described. The layout of the first to fourth areas A31, A32, A33, and A34 is the same as that in the fourth example embodiment except for the layout of the second and third areas A32 and A33 with respect to the first and fourth areas A31 and A34. In the present example embodiment, the second area A32 and the third area A33 are located forward of the first area A31 and the fourth area A34, respectively, in the Y direction.

The operation and effect of the magnetic sensor device 1 according to the present example embodiment will now be described. In the present example embodiment, the layout of the first to fourth areas A21, A22, A23, and A24 in the element layout area of the first magnetic sensor 10 is defined as described above. Moreover, in the present example embodiment, the magnetization directions of the magnetization pinned layers 52 in each of the first to fourth resistor sections R11, R12, R13, and R14 of the first magnetic sensor 10 and the magnetization directions of the free layers 54 in each of the first to fourth resistor sections R11, R12, R13, and R14 are defined as described in the first example embodiment (see FIG. 8). According to the present example embodiment, an offset in the first detection value Su can thus be prevented.

The reason why an offset in the first detection value Su can be prevented will be described in detail below. A case where stress in the second reference direction Ry is applied to the first magnetic sensor 10 will initially be described. As in the fourth example embodiment (the first example embodiment), the resistance of the first resistor section R11 will be denoted by r1, the resistance of the second resistor section R12 by r2, the resistance of the third resistor section R13 by r3, and the resistance of the fourth resistor section R14 by r4. Like the fourth example embodiment, if stress in the second reference direction Ry is applied to the first magnetic sensor 10, r1 and r4 increase and r2 and r3 decrease, or r1 and r4 decrease and r2 and r3 increase. The stress applied to the first and fourth areas A21 and A24 is lower than that applied to the second and third areas A22 and A23. The amounts of change in r1 and r4 due to the stress are thus smaller than the amounts of change in r2 and r3 due to the stress. If the mode of change in r1, r2, r3, and r4 described above is applied to the expression (3) in the first example embodiment, the potential difference E ideally hardly changes. In other words, hardly any offset occurs in the first detection value Su even if stress in the third reference direction Rx is applied to the first magnetic sensor 10.

Next, a case where stress in the third reference direction Rx is applied to the first magnetic sensor 10 will be described. The mode of increase and decrease in r1, r2, r3, and r4 when stress in the third reference direction Rx is applied to the first magnetic sensor 10 is the same as when stress in the second reference direction Ry is applied to the first magnetic sensor 10. Like the fourth example embodiment, the amounts of change in r1, r2, r3, and r4 due to the stress are substantially the same. The mode of change in r1, r2, r3, and r4 described above is the same as that in r1, r2, r3, and r4 when stress in the third reference direction Rx is applied to the first magnetic sensor 10 of the fourth example embodiment. From the same reason as described in the fourth example embodiment, hardly any offset therefore occurs in the first detection value Su if stress in the third reference direction Rx is applied to the first magnetic sensor 10.

According to the present example embodiment, an offset in the first detection value Su can thus be prevented.

Up to this point, the description has been given by using the first magnetic sensor 10 as an example. The foregoing description also applies to the second and third magnetic sensors 20 and 30. According to the present example embodiment, an offset in the second detection value Sv and an offset in the third detection value Sz can be prevented.

The configuration, operation, and effects of the present example embodiment are otherwise the same as those of the fourth example embodiment.

The technology is not limited to the foregoing example embodiments, and various modifications may be made thereto. For example, the magnetic sensor device and the magnetic sensor system according to the technology are not limited to the case of detecting the relative position of the magnetic field generator with respect to the magnetic sensor device, and may also be applied to a case of detecting the orientation of the magnetic sensor device configured to be rotatable in a predetermined magnetic field.

The plurality of second MR elements 50B of the second magnetic sensor 20 and the plurality of MR elements 50C of the third magnetic sensor 30 are not limited to the inclined surfaces 35a and 35b of the plurality of grooves 35c, and may be formed on inclined surfaces of a plurality of protrusions protruding in the Z direction from the top surface of the insulating layer 35.

The second chip 3 may include two magnetic sensors to be used to generate detection values corresponding to the component of the external magnetic field in the direction parallel to the V direction and the component of the external magnetic field in the direction parallel to the Z direction, instead of the second and third magnetic sensors 20 and 30.

The first chip 2 may include a magnetic sensor to be used to generate a detection value corresponding to the component of the external magnetic field in the direction parallel to the V direction, instead of the first magnetic sensor 10. The second chip 3 may include two magnetic sensors to be used to generate a detection value corresponding to the component of the external magnetic field in the direction parallel to the U direction and a detection value corresponding to the component of the external magnetic field in the direction parallel to the Z direction instead of the second and third magnetic sensors 20 and 30.

The processor 40 does not need to be included in the support 4 and not need to be integrated with the first and second chips 2 and 3.

The first to third magnetic sensors 10, 20, and 30 may be included in one chip. In such a case, the reference plane may be the top surface of the chip. The element layout area of the first magnetic sensor 10 and the element layout area of the second and third magnetic sensors 20 and 30 may be included in the reference plane.

The magnetic sensor device 1 does not need to include both the first chip 2 and the second chip 3.

The element layout area of the first magnetic sensor 10 and the element layout area of the second and third magnetic sensors 20 and 30 may be disposed in an orientation 90° rotated from the orientation shown in the diagrams about the center of gravity C4 of the reference plane 4*a*. In such a case, the second reference direction is a direction parallel to the X direction, and the third reference direction is a direction parallel to the Y direction.

The element layout area of the first magnetic sensor 10 and the element layout area of the second and third magnetic sensors 20 and 30 may be disposed in an orientation 180° rotated from the orientation shown in the drawings about the center of gravity C4 of the reference plane 4*a*.

The angle that the first magnetization direction forms with respect to the second reference direction Ry may be 0° or 90°.

In the third to fifth example embodiments, the magnetization directions of the free layers 54 of the MR elements 50 may be the same as in the second example embodiment.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor device comprising:
    at least one magnetic sensor configured to detect a target magnetic field that is a magnetic field to be detected, the at least one magnetic sensor including a plurality of magnetoresistive elements and an element layout area for laying out the plurality of magnetoresistive elements; and
    a support that supports the at least one magnetic sensor and has a reference plane, wherein:
    when the magnetic sensor device is seen in a first reference direction, a center of gravity of the element layout area is deviated from a center of gravity of the reference plane, the first reference direction being a direction perpendicular to the reference plane;
    the at least one magnetic sensor further includes
        a first resistor section and a second resistor section connected in series in a first path that is a path electrically connecting a first connection point and a second connection point, and
        a third resistor section and a fourth resistor section connected in series in a second path that is a path electrically connecting the first connection point and the second connection point;
    the first and fourth resistor sections are connected to the first connection point;
    the second and third resistor sections are connected to the second connection point;
    the plurality of magnetoresistive elements constitute the first to fourth resistor sections;
    each of the plurality of magnetoresistive elements includes a magnetization pinned layer having magnetization whose direction is fixed, a free layer having magnetization whose direction is variable depending on the target magnetic field, and a gap layer located between the magnetization pinned layer and the free layer;
    the magnetization of the magnetization pinned layer in each of the first and third resistor sections includes a component in a first magnetization direction, the first magnetization direction being a direction intersecting the first reference direction;
    the magnetization of the magnetization pinned layer in each of the second and fourth resistor sections includes a component in a second magnetization direction, the second magnetization direction being a direction intersecting the first reference direction and opposite to the first magnetization direction;
    the magnetization of the free layer in each of two of the first to fourth resistor sections includes a component in a third magnetization direction when the target magnetic field is not applied to the at least one magnetic sensor, the third magnetization direction being a direction intersecting the first reference direction and orthogonal to the first magnetization direction; and
    the magnetization of the free layer in each of the other two of the first to fourth resistor sections includes a component in a fourth magnetization direction when the target magnetic field is not applied to the at least one magnetic sensor, the fourth magnetization direction being a direction intersecting the first reference direction and opposite to the third magnetization direction.

2. The magnetic sensor device according to claim 1, wherein:
    the magnetization of the free layer in each of the first and second resistor sections includes a component in the third magnetization direction when the target magnetic field is not applied to the at least one magnetic sensor; and
    the magnetization of the free layer in each of the third and fourth resistor sections includes a component in the fourth magnetization direction when the target magnetic field is not applied to the at least one magnetic sensor.

3. The magnetic sensor device according to claim 1, wherein:
    the magnetization of the free layer in each of the first and fourth resistor sections includes a component in the third magnetization direction when the target magnetic field is not applied to the at least one magnetic sensor; and
    the magnetization of the free layer in each of the second and third resistor sections includes a component in the fourth magnetization direction when the target magnetic field is not applied to the at least one magnetic sensor.

4. The magnetic sensor device according to claim 1, wherein:
- a deviation of the center of gravity of the element layout area from the center of gravity of the reference plane in a second reference direction is greater than a deviation of the center of gravity of the element layout area from the center of gravity of the reference plane in a third reference direction, the second reference direction and the third reference direction being two directions orthogonal to the first reference direction; and
- an angle that the first magnetization direction forms with respect to the second reference direction is in a range greater than 0° and less than 90°.

5. The magnetic sensor device according to claim 1, wherein:
- the at least one magnetic sensor further includes a magnetic field generator; and
- the magnetic field generator is configured to apply a magnetic field, in a direction intersecting each of the first to fourth magnetization directions, to the free layer.

6. The magnetic sensor device according to claim 1, wherein:
- the at least one magnetic sensor further includes a magnetic field generator; and
- the magnetic field generator is configured to apply a magnetic field, in the third magnetization direction or in the fourth magnetization direction, to the free layer.

7. The magnetic sensor device according to claim 1, wherein:
- a deviation of the center of gravity of the element layout area from the center of gravity of the reference plane in a second reference direction is greater than a deviation of the center of gravity of the element layout area from the center of gravity of the reference plane in a third reference direction, the second reference direction and the third reference direction being two directions orthogonal to the first reference direction;
- the element layout area includes
  - a first area for laying out at least one magnetoresistive element constituting the first resistor section among the plurality of magnetoresistive elements,
  - a second area for laying out at least one magnetoresistive element constituting the second resistor section among the plurality of magnetoresistive elements,
  - a third area for laying out at least one magnetoresistive element constituting the third resistor section among the plurality of magnetoresistive elements, and
  - a fourth area for laying out at least one magnetoresistive element constituting the fourth resistor section among the plurality of magnetoresistive elements; and
- at least two of the first to fourth areas are arranged along the third reference direction so that at least parts of the respective at least two areas sandwich a reference axis therebetween when the areas are seen in the first reference direction, the reference axis being a straight line parallel to the second reference direction and passing through the center of gravity of the reference plane.

8. The magnetic sensor device according to claim 7, wherein:
- the second area and the fourth area are arranged along the third reference direction to sandwich the reference axis therebetween when the areas are seen in the first reference direction;
- the first area is located between the second area and the fourth area when the areas are seen in the first reference direction; and
- the third area is located between the first area and the second area when the areas are seen in the first reference direction.

9. The magnetic sensor device according to claim 7, wherein:
- the second area and the third area are arranged along the third reference direction to sandwich the reference axis therebetween when the areas are seen in the first reference direction;
- the first area is located between the second area and the third area when the areas are seen in the first reference direction; and
- the fourth area is located between the first area and the third area when the areas are seen in the first reference direction.

10. The magnetic sensor device according to claim 7, wherein:
- the first area and the fourth area are arranged along the third reference direction so that at least parts of the respective first and fourth areas sandwich the reference axis therebetween when the areas are seen in the first reference direction;
- the second area and the third area are arranged along the third reference direction so that at least parts of the respective second and third areas sandwich the reference axis therebetween when the areas are seen in the first reference direction; and
- the second area and the third area are located forward of the first area and the fourth area, respectively, in a direction parallel to the second reference direction.

11. The magnetic sensor device according to claim 10, wherein:
- the first area and the second area are symmetrically arranged about a virtual straight line orthogonal to the reference axis when the areas are seen in the first reference direction; and
- the third area and the fourth area are symmetrically arranged about the virtual straight line when the areas are seen in the first reference direction.

12. The magnetic sensor device according to claim 7, wherein the at least two areas are symmetrically arranged about the reference axis when the areas are seen in the first reference direction.

13. The magnetic sensor device according to claim 7, wherein the center of gravity of the element layout area overlaps the reference axis when the element layout area is seen in the first reference direction.

14. The magnetic sensor device according to claim 1, wherein:
- the at least one magnetic sensor includes one magnetic sensor; and
- the one magnetic sensor is configured to detect a component of the target magnetic field in one direction, and generate at least one detection signal having a correspondence with the component in the one direction.

15. The magnetic sensor device according to claim 14, further comprising a chip including the one magnetic sensor, wherein
- the chip is mounted on the reference plane.

16. The magnetic sensor device according to claim 1, wherein:
- the at least one magnetic sensor includes two magnetic sensors; and the two magnetic sensors are configured to detect components of the target magnetic field in two directions different from each other.

17. The magnetic sensor device according to claim 16, further comprising a chip including the two magnetic sensors, wherein the chip is mounted on the reference plane.

18. The magnetic sensor device according to claim 16, wherein each of the two directions of the target magnetic field is a direction oblique to both the reference plane and the first reference direction.

19. The magnetic sensor device according to claim 1, wherein:

the at least one magnetic sensor includes a first magnetic sensor, a second magnetic sensor, and a third magnetic sensor;

the first magnetic sensor is configured to detect a component of the target magnetic field in a first direction;

the second magnetic sensor is configured to detect a component of the target magnetic field in a second direction;

the third magnetic sensor is configured to detect a component of the target magnetic field in a third direction;

the magnetic sensor device further comprises a first chip including the first magnetic sensor, and a second chip including the second and third magnetic sensors; and the first and second chips are mounted on the reference plane, and arranged along a second reference direction orthogonal to the first reference direction.

20. The magnetic sensor device according to claim 19, wherein:

the first direction is a direction parallel to the reference plane;

the second direction is a direction oblique to both the reference plane and the first reference direction; and the third direction is another direction oblique to both the reference plane and the first reference direction.

21. A magnetic sensor system comprising:

the magnetic sensor device according to claim 1; and a magnetic field generator that generates a predetermined magnetic field, wherein the magnetic field generator is able to change a relative position of the magnetic field generator with respect to the magnetic sensor device along a predetermined spherical surface.

22. A manufacturing method for the magnetic sensor device according to claim 1, comprising:

a step of forming the at least one magnetic sensor; and a step of mounting the at least one magnetic sensor on the support, wherein the step of forming the at least one magnetic sensor includes a step of forming the plurality of magnetoresistive elements; and the step of forming the plurality of magnetoresistive elements includes a step of forming a plurality of initial magnetoresistive elements each including an initial magnetization pinned layer to later become the magnetization pinned layer, the free layer, and the gap layer, and a step of fixing a magnetization direction of the initial magnetization pinned layer using laser light and an external magnetic field.

* * * * *